US012805035B2

(12) United States Patent
Huang et al.

(10) Patent No.: US 12,805,035 B2
(45) Date of Patent: Nov. 17, 2026

(54) STEPPED BACK SIDE DEEP TRENCH ISOLATON STRUCTURE

(71) Applicant: Taiwan Semiconductor Manufacturing Company, Ltd., Hsinchu (TW)

(72) Inventors: Sin-Yao Huang, Tainan City (TW); Sheng Chieh Chuang, Hsinchu (TW); Shu Yen Kung, Tainan City (TW); Shin-Sheng Huang, Tainan City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 19/413,067

(22) Filed: Dec. 9, 2025

(65) Prior Publication Data

US 2026/0107587 A1 Apr. 16, 2026

Related U.S. Application Data

(63) Continuation of application No. 18/164,823, filed on Feb. 6, 2023, now Pat. No. 12,527,100.

(51) Int. Cl.

*H10F 39/12* (2025.01)
*H10F 39/00* (2025.01)
*H10F 39/18* (2025.01)

(52) U.S. Cl.

CPC ......... *H10F 39/199* (2025.01); *H10F 39/014* (2025.01); *H10F 39/18* (2025.01)

(58) Field of Classification Search

CPC ....... H10F 39/199; H10F 39/014; H10F 39/18
See application file for complete search history.

(56) References Cited

U.S. PATENT DOCUMENTS

2014/0312391 A1* 10/2014 Ihara ................. H10F 39/80373 257/229
2015/0130016 A1* 5/2015 Kao ..................... H10D 62/115 438/433

* cited by examiner

*Primary Examiner* — Robert J May
(74) *Attorney, Agent, or Firm* — Eschweiler & Potashnik, LLC

(57) ABSTRACT

Trenches for a back side deep trench isolation (BDTI) structure are formed using two etches: a high-aspect ratio etch and a mouth etch. The trenches have an upper part (the mouth) that is wider and the lower part of the trenches. The lower part is narrower and has a higher aspect ratio than the upper part. The trenches exhibit a step change in width between the upper part and the lower part. The depth of the lower part may be fixed to provide an aspect ratio that is high but limited to an aspect ratio at which the lower part may be consistently filled without creating voids. The overall depth of the trenches may be varied by adjusting the depth of the mouth area. The resulting BDTI structure provides an image sensor with better optical performance characteristics than may be achieved using a single trench etch.

20 Claims, 25 Drawing Sheets

STEPPED BACK SIDE DEEP TRENCH ISOLATON STRUCTURE

REFERENCE TO RELATED APPLICATION

This Application is a Continuation of U.S. application Ser. No. 18/164,823, filed on Feb. 6, 2023, the contents of which are hereby incorporated by reference in their entirety.

BACKGROUND

Integrated circuits (ICs) comprising image sensors are used in a wide range of modern-day electronic devices such as cameras and cell phones. Complementary metal-oxide semiconductor (CMOS) image sensors (CISs) have become popular. Compared to charge-coupled devices (CCDs), CISs are increasingly favored due to low power consumption, small pixel size, fast data processing, and low manufacturing cost. As the pixel sizes are made smaller, manufacturing becomes increasingly difficult as does limiting crosstalk between pixels. These are ongoing challenges where unique solutions can provide improved performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
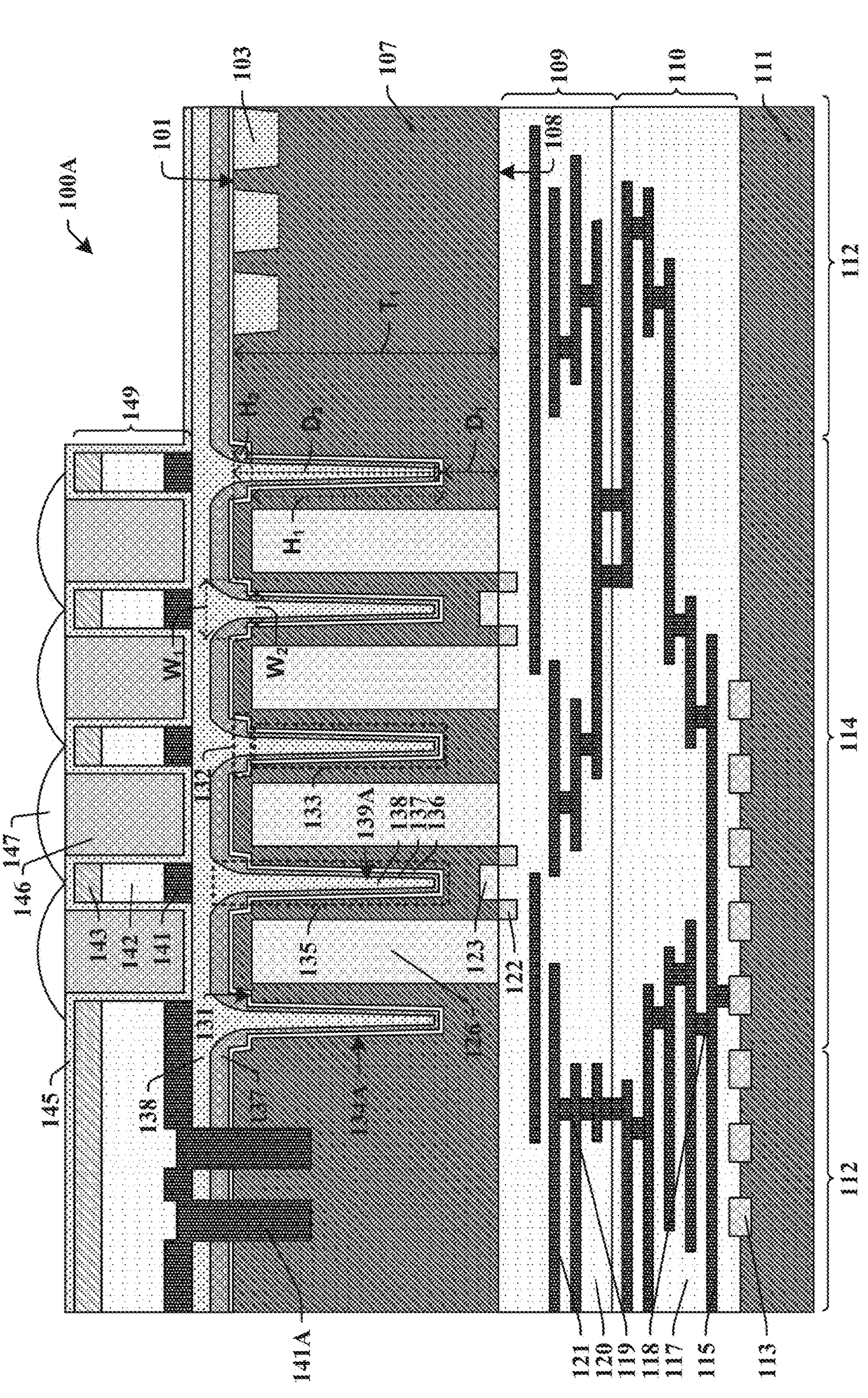
FIGS. 1-4 and 4A illustrate image sensors according to various embodiments of the present disclosure.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some CISs are designed for back side illumination (BSI) and include an array of photodetectors within a semiconductor substrate. The photodetectors may be separated by a back side deep trench isolation (BDTI) structure which is an isolation structure that extends into the semiconductor substrate from its back side. The BDTI structure may include square-shaped or ring-shaped elements that laterally surround and separate the photodetectors. Forming the BDTI structure includes etching BDTI trenches in the back side of the semiconductor substrate and filling the BDTI trenches with the materials that provide the BDTI structure. As the photodetector pitch is made smaller, the BDTI structure takes up a progressively larger proportion of the image sensing area. That tendency may be offset by making the BDTI structure narrower. As attempts are made to narrow the BDTI structure the BDTI trenches become susceptible to pinching off at the top during backfill leaving voids within the BDTI structure. Those voids degrade optical performance characteristics.

According to the present disclosure the BDTI trenches are formed in first areas using a high-aspect ratio etch and a mouth etch. The mouth etch uses a mask with a similar layout to the mask used for the high-aspect ratio etch, but the mask for the mouth etch has wider openings. As a result of those two etches, the BDTI trenches have an upper part (the mouth) that is wider and a lower part that is narrower and has a higher aspect ratio. The BDTI trenches exhibit a step change in width between the upper part and the lower part. A step change in width is a sudden narrowing of the type that produces a discontinuity in a graph of width versus depth. The BDTI trenches will form a horizontal lower surface at the height at which the abrupt narrowing occurs. The depth and width of the lower part may be fixed to provide a high aspect ratio at which the lower part may be consistently filled without creating voids. The depth of the upper part may be varied to achieve the desired total depth of the BDTI trenches. The resulting BDTI structure may provide the image sensor with better optical performance characteristics than may be achieved using a single trench etch.

Some aspects of the present disclosure relate to an image sensor of the type that is formed by a method of the present disclosure. The image sensor includes a BDTI structure that extends into the back side of a semiconductor substrate to laterally surround photodetectors. In a first area, the BDTI structure exhibits a step-change in width within the semiconductor substrate. In some embodiments, the semiconductor substrate forms a ledge corresponding to the step change in width. In the first area, the BDTI structure includes an upper part that is within the semiconductor substrate and is above the level at which the step change occurs and a lower part that is within the semiconductor substrate and is below the level at which the step change occurs. In some embodiments, the lower part has a greater height (vertical extent) than the upper part. In some embodiments, the lower part has an aspect ratio that is greater than an aspect ratio of the upper part. In some embodiments, the lower part has a width that remains constant or decreases with increasing depth. The upper part may also have a width that remains constant or decreases with increasing depth.

In some embodiments there are second areas within which the BDTI structure does not exhibit a step change in width. In some embodiments, floating diffusion regions are formed proximate the front side directly beneath the BDTI structure in the second areas. The BDTI trenches are shallower in the second areas as comparted to the first areas. In the first areas, the depth of the BDTI structure includes contributions from the upper part and the lower part. In some embodiments, a depth of the BDTI structure in the second areas equals just the height (vertical extent) of the lower part. Considering horizontal lower surfaces of the BDTI structure to be bottom surfaces, the BDTI structure may have bottom surface at three distinct depths. A first depth corresponds to a depth of the mouth etch and is a depth of the ledges. A second depth corresponds to a depth of the high-aspect ratio etch and is a depth of the BDTI structure in the second areas. A third depth corresponds to the combined depth of the mouth etch and the high-aspect ratio etch and is a depth of the BDTI structure in the first areas. In the second areas the BDTI structure may have a depth limit that is set to accommodate the floating diffusion regions. In the first areas the BDTI structure may have a depth that exceeds that limit.

In some embodiments, scribe lines are formed in conjunction with the mouth etch. The scribe lines thus formed may have the same height as the upper part and may have the same depth as the ledges. Forming scribe lines in conjunction with the mouth etch may eliminate a mask.

In some embodiments, an upper passivation layer is formed on the back side. The upper passivation layer may be silicon oxide (SiO) or some other transparent material with a relatively low refractive index. In some embodiments, an intermediate passivation layer is disposed between the upper passivation layer and the back side. The intermediate passivation layer is transparent and has a refractive index between that of the semiconductor substrate and that of the upper passivation layer. In some embodiments, the intermediate passivation is tantalum oxide (TaO). The intermediate passivation layer and the upper passivation layer are disposed between the photodetectors and corresponding lenses on the backside. One or both of the intermediate passivation layer and the upper passivation layer may dip into the semiconductor substrate to form part of the BDTI structure. In some embodiments, the upper passivation layer provides core fill for the BDTI structure. In some embodiments a substrate-embedded metal grid is at the core of the BDTI structure.

In some embodiments, the high-aspect ratio etch is performed first. In some embodiments, the high-aspect ratio etch is of a type that forms a trench that narrows at the top to form a neck. That type of etch may allow the trenches to have a higher aspect ratio than another type of etch that does not leave a neck at the top of the trench. The mouth etch removes the top of the BDTI trenches where the neck might otherwise remain. In these embodiments, the mouth etch may increase the depths of the BDTI trenches to a limited extent.

In some embodiments, the mouth etch is performed first. Performing the mouth etch first makes the high aspect ratio etch and the mouth etch more additive in terms of depth and results in deeper BDTI trenches. The high aspect ratio etch may be set to the highest aspect ratio at which the lower portion may be back filled without voids. The depth of the mouth etch may then be adjusted so that the depth of the mouth etch plus the depth of the high aspect ratio etch reaches the desired overall BDTI trench depth. In some embodiments, scribe lines are formed in conjunction with the mouth etch. If the mouth etch is first, the resulting scribe lines may be used to align the high aspect ratio etch. In some embodiments second areas, which may be areas that are directly over floating diffusion regions, are masked during the mouth etch whereby the BDTI trenches are shallower in the second areas as compared to first areas.

After the BDTI trenches are formed they may be lined with dielectric material. In some embodiments, the dielectric material is of a type that exhibits fixed negative charges. One or more passivation layers may then be formed on the back side. The passivation layers may be much thicker than the dielectric liner. In some embodiments, each of the passivation layers has a thickness on the back side that is greater than a width of the BDTI trenches. The passivation layers may be deposited using a non-conformal deposition process whereby they deposit more thinly in the trenches than they do on the back side. In some embodiments, the passivation layers fill the trenches. In some embodiments, the passivation layers are deposited without filling the trenches. In the latter case, a metal may be subsequently deposited to complete the BDTI trench fill. Such a metal may provide a substrate-embedded metal grid that provides improved optical performance characteristics such as increased quantum efficiency and reduced crosstalk between photodetectors.

FIG. 1 illustrates a cross-section of an image sensor 100A according to some aspects of the present disclosure. The image sensor 100A may include a first semiconductor substrate 107 bonded to a second semiconductor substrate 111. The first semiconductor substrate 107 has a front side 108, a back side 101, an image sensing area 114, and a peripheral area 112. Various structures such as scribe lines 103 and ground bars 141A may be formed in the peripheral area 112. Photodetectors 126 and floating diffusion regions 123 may be disposed in the image sensing area 114.

The photodetectors 126 may comprise photodiodes or the like and may be coupled to the floating diffusion regions 123 through transfer gates 122 formed on the front side 108. There may be one floating diffusion region 123 for every four photodetector 126. Alternatively, there may be one floating diffusion region 123 for each pair of photodetectors 126 or one for each individual photodetector 126. Aside from the transfer gates 122, additional transistors may be associated with the photodetector 126. Those additional transistors may include select gates, reset gates, and the like and may be on the first semiconductor substrate 107, on the second semiconductor substrate 111, or some on each.

Micro-lenses 147 may be disposed directly above the photodetectors 126. As light travels from micro-lenses 147 to the photodetectors 126, it passes through color filters 146, an upper passivation layer 138, and an intermediate passivation layer 137. The upper passivation layer 138 and the intermediate passivation layer 137 suppress reflections. A composite grid 149 at the height of the color filters helps divide light among the photodetectors 126. The composite grid 149 may include a back side metal grid 141, a dielectric grid 142, and a hard mask grid 143. An encapsulation layer 145 may extend over the composite grid 149.

A BDTI structure 134A is disposed directly below the composite grid 149 and extends through the back side 101 into the first semiconductor substrate 107 to laterally surround photodetectors 126. The BDTI structure 134A includes segments 135 which are disposed between adjacent photodetectors 126. A dielectric liner 136 separates a core 139A of the BDTI structure 134A from the first semiconductor substrate 107. All or part of the core 139A may be provided by portions of the intermediate passivation layer 137 and/or the upper passivation layer 138 that descend into the first semiconductor substrate 107 within the segments 135. It should be appreciated that the illustrations exaggerate the dimensions of the BDTI structure 134A in comparison to the dimensions of the photodetectors 126 in order to show details of the BDTI structure 134A. In some embodiments, the BDTI structure 134A of about 120 nm or less.

The BDTI structure 134A extends into the first semiconductor substrate 107 to within a distance $D_1$ of the front side 108. In some embodiments, the distance $D_1$ is in the range from zero to about 1.5 μm. In some embodiments, the distance $D_1$ is in the range from 0.5 μm to about 1 μm. Having the BDTI structure 134A come close to the front side 108 reduces crosstalk between the photodetectors 126. Spacing the BDTI structure 134A from the front side 108 allows structures such as floating diffusion regions 123 to be formed directly beneath the segments 135.

The first semiconductor substrate 107 has a thickness $T_1$ suitable for the photodetectors 126. In some embodiments, the thickness $T_1$ is in the range from about 2 μm to about 5 μm. In some embodiments, the thickness $T_1$ is in the range from about 3 μm to about 3.5 μm. In some embodiments, the BDTI structure 134A extends to a depth $D_2$ in the range from about 2 μm to about 5 μm into the first semiconductor substrate 107. In some embodiments, the depth $D_2$ is in the range from about 2.5 μm to about 4 μm.

The segments 135 comprise an upper portion 132 and a lower portion 133. A step change from a width $W_1$ to a width $W_2$ occurs between the upper portion 132 and the lower portion 133. In some embodiments, the width $W_2$ is in the range from about 50 nm to about 200 nm. In some embodiments, the width $W_2$ is in the range from about 80 nm to about 120 nm. In some embodiments, the width $W_1$ is at least about 50% greater than the width $W_2$. In some embodiments, the width $W_1$ is at least about double the width $W_2$.

The first semiconductor substrate 107 forms a ledge 131 where the step change in width occurs. The lower portion 133 has a higher aspect ratio than the upper portion 132. In some embodiments, the aspect ratio of the lower portion 133 is in the range from about 10:1 to about 25:1. In some embodiments, the aspect ratio of the lower portion 133 is no more than about 16:1. If the aspect ratio of the lower portion 133 is greater than about 16:1, it may be difficult to fill the lower portion 133 without leaving voids within. For example, if the width $W_2$ is 120 nm, it may be difficult to fill the lower portion 133 if the height $H_1$ of the lower portion is about 2 μm or more.

In some embodiments, the height $H_1$ of the lower portion 133 is in the range from about 1 μm to about 3 μm. In some embodiments, the height $H_1$ is in the range from about 1.5 μm to about 2.5 μm. In some embodiments, the height $H_2$ of the upper portion is in the range from about 0.4 μm to about 2 μm. In some embodiments, the height $H_2$ is in the range from about 0.5 μm to about 1.5 μm.

The dielectric liner 136 is transparent and includes one or more layers of any suitable dielectrics. In some embodiments, the dielectric liner 136 includes one or more layers of dielectrics that exhibit fixed negative charges. Examples of dielectrics that exhibit fixed negative charges include hafnium oxide (HfO), aluminum oxide (AlO), and the like. In some embodiments, the dielectric liner 136 includes a first dielectric layer and a second dielectric layer. For example, the first dielectric layer may be aluminum oxide (AlO) or the like and the second dielectric layer may be hafnium oxide (HfO) or the like. In some embodiments, the first dielectric layer has a thickness in the range from about 20 Angstroms to about 100 Angstroms, e.g., about 40 Angstroms. In some embodiments, the second dielectric layer has a thickness in the range from about 30 Angstroms to about 200 Angstroms, e.g., about 60 Angstroms. In some embodiments, the dielectric liner 136 as a whole has a thickness in the range from about 50 Angstroms to about 200 Angstroms, e.g., about 100 Angstroms.

The intermediate passivation layer 137 and the upper passivation layer 138 are much thicker than the dielectric liner 136. In some embodiments their thicknesses are each greater than the width $W_2$. In some embodiments their thicknesses are each greater than the width $W_1$. The upper passivation layer 138 may be any suitable material that is transparent and has a relatively low refractive index. Materials that may be suitable include silicon oxide (SiO), silicon nitride (SiN), hafnium oxide (HfO), titanium dioxide (TiO), and the like. In some embodiments, the upper passivation layer 138 is or comprises silicon oxide (SiO) or the like. In some embodiments, the upper passivation layer 138 has a thickness in the range from about 300 Angstroms to about 2500 Angstroms, e.g., about 500 Angstroms.

The intermediate passivation layer 137 is a transparent material that has a refractive index between that of the upper passivation layer 138 and that of the first semiconductor substrate 107. Materials that may be suitable include silicon nitride (SiN), hafnium oxide (HfO), aluminum oxide (AlO), titanium oxide (TiO), or the like. In some embodiments, the intermediate passivation layer 137 is tantalum oxide (TaO) or the like. In some embodiments, the intermediate passivation layer 137 has a thickness in the range from about 300 Angstroms to about 2500 Angstroms, e.g., about 500 Angstroms. The thicknesses of the intermediate passivation layer 137 and the upper passivation layer 138 may be varied in relation to a wavelength of light that is targeted by the image sensor 100A.

Figure 2:
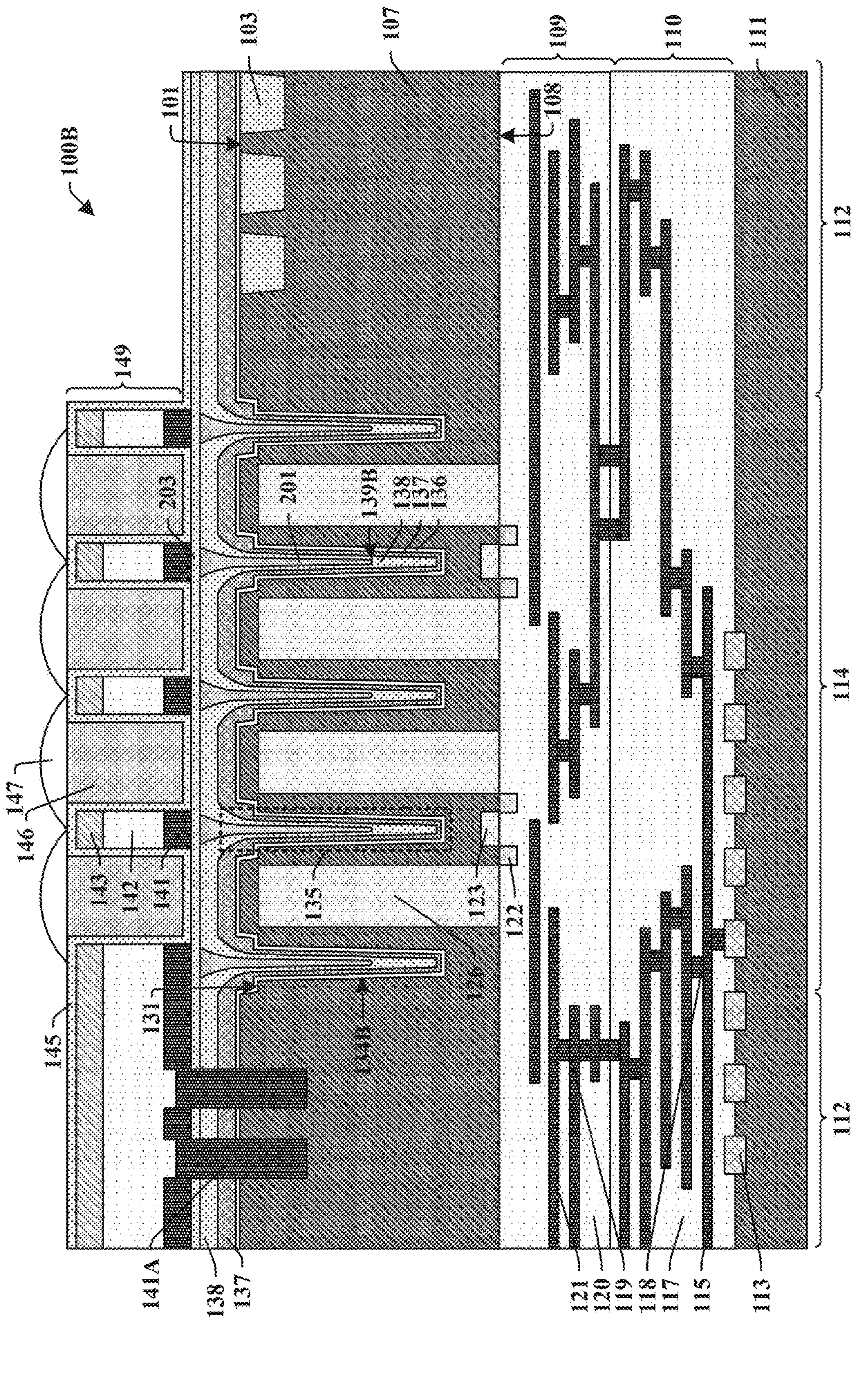

FIG. 2 illustrates a cross-sectional views of an image sensor 100B that includes a BDTI structure 134B. The image sensor 100B is like the image sensor 100A of FIG. 1 except that the image sensor 100B has a BDTI structure 134B that includes a substrate-embedded metal grid 201 as part of its core 139B. A dielectric layer 203 separates the substrate-embedded metal grid 201 from the back side metal grid 141. The dielectric layer 203 is transparent and may be directly on the upper passivation layer 138. In some embodiments, the dielectric layer 203 has the same composition as the upper passivation layer 138. In some embodiments, the substrate-embedded metal grid 201 is biased to a negative voltage. The negative voltage may be applied from a source within the image sensor 100B or from an external source using a contact pad. Alternatively, the substrate-embedded metal grid 201 may be grounded.

The substrate-embedded metal grid 201 may be any suitable metal. In some embodiments, the substrate-embedded metal grid 201 is or comprises aluminum (Al), tungsten (W), or the like. Aluminum and tungsten have the advantage of being amenable to deposition in high aspect ratio openings. In some embodiments, the substrate-embedded metal grid 201 comprises tungsten (W), or the like. Tungsten (W) is particularly suitable for deposition in high aspect ratio openings. In some embodiments, the substrate-embedded metal grid 201 comprises aluminum (Al) or the like. Aluminum (Al) has the advantage of high conductivity.

Figure 3:
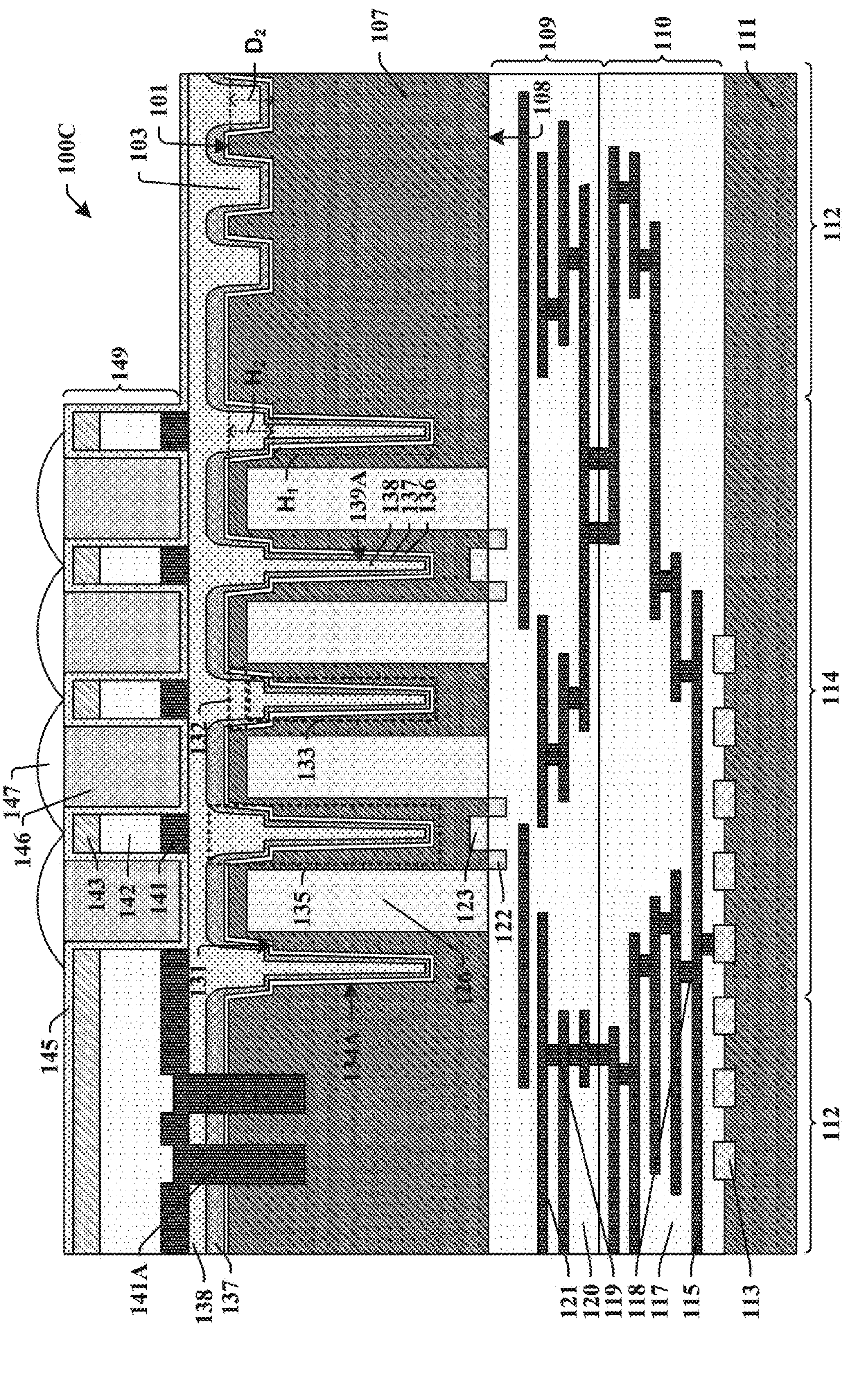

FIG. 3 illustrates a cross-sectional views of an image sensor 100C that is like the image sensor 100A of FIG. 1 except that the scribe lines 103 have a depth $D_2$ that is the same as the height $H_2$ of the upper portions 132 and the scribe lines 103 have the same composition as the BDTI structure 134A. That composition includes the dielectric liner 136 and the core 139A. In this example, the core 139A includes the intermediate passivation layer 137 and the upper passivation layer 138. These layers may have thicknesses in the scribe lines 103 that are different from their thicknesses in the BDTI structure 134A due to trench width affecting deposition rates.

Figure 4:
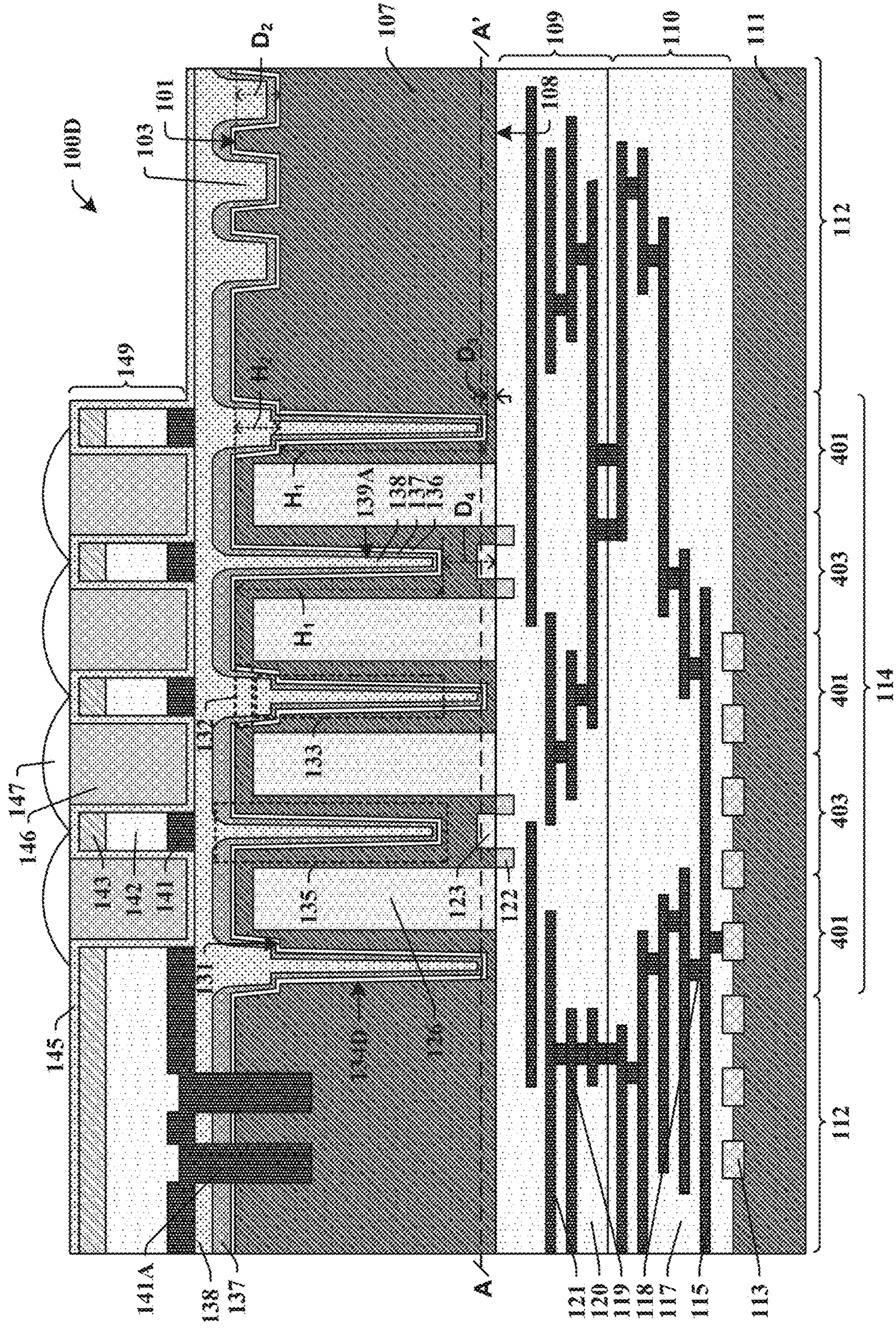

FIG. 4 illustrates a cross-sectional views of an image sensor 100D that is like the image sensor 100C of FIG. 3 in most respects. The image sensor 100D has a BDTI structure 134D that is like the BDTI structure 134C of FIG. 3 except that in first areas 401 the BDTI structure 134D comes to within a distance $D_3$ of the front side 108 and in second areas 403 remains a greater distance $D_4$ from the front side 108. The floating diffusion regions 123 are in the second areas 403 and the BDTI structure 134D lacks the upper portion 132 in the second areas 403. A difference between the distance $D_4$ and the distance $D_3$ approximately equals the height $H_2$ of the upper portion 132.

Figure 4A:
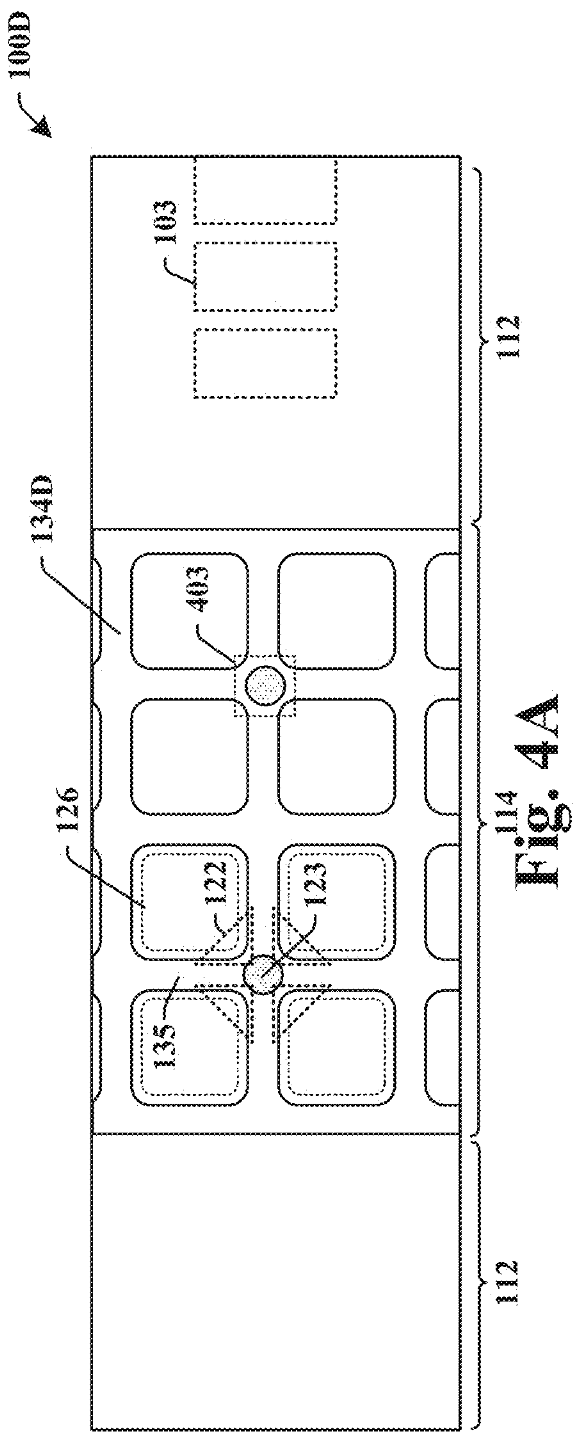

FIG. 4A illustrates a plan view of the image sensor 100D focusing on the plane A-A' of FIG. 4. As shown by FIG. 4A the BDTI structure 134D forms a grid in the first areas 401 (see FIG. 4) of the image sensing area 114 but not in the second areas 403. One of the second areas 403 is labeled on the right side of the image sensing area 114. In the second areas 403, the BDTI structure 134D is too shallow to reach the plane A-A'. The locations of four transfer gates 122 that are associated with one floating diffusion region 123 and respective photodetectors 126 are labeled on the left side of the image sensing area 114. The scribe lines 103 are shown to be rectangular.

FIGS. 5-17 are cross-sectional view illustrations exemplifying a method according to the present disclosure of forming the image sensor 100A. While FIGS. 5-17 are described with reference to various embodiments of a method, it will be appreciated that the structures shown in FIGS. 5-17 are not limited to the method but rather may stand alone separate from the method. While FIGS. 5-17 are described as a series of acts, it will be appreciated that the order of the acts may be altered in other embodiments. While FIGS. 5-17 illustrate and describe a specific set of acts, some acts that are illustrated and/or described may be omitted in other embodiments. Further, acts that are not illustrated and/or described may be included in other embodiments. While the method of FIGS. 5-17 is described in terms of forming the image sensor 100A, the method and variants thereof may be used to form other image sensors according to the present disclosure.

Figure 5:
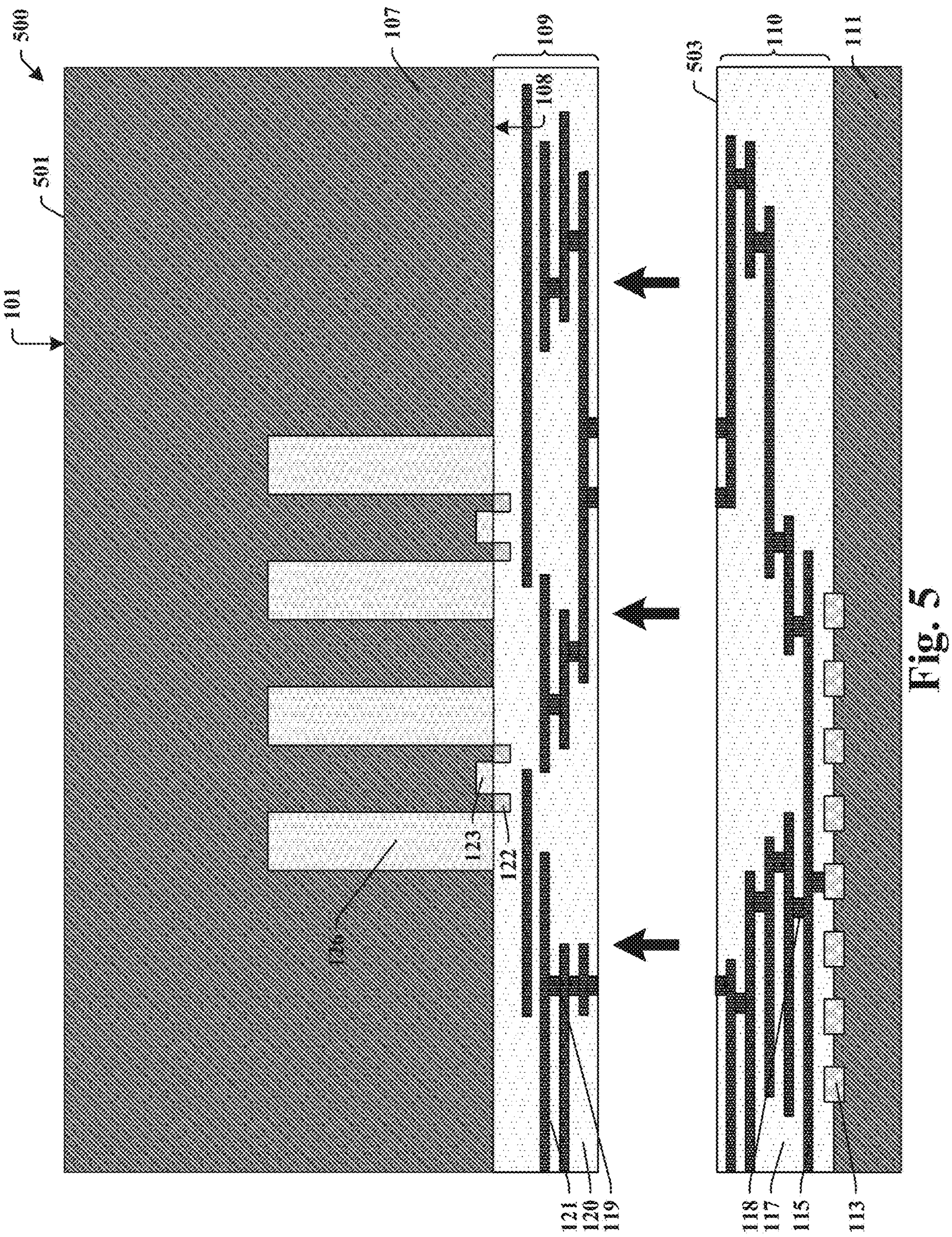
FIGS. 5-17 are a series of views illustrating a method according to some embodiments of the present disclosure for forming an image sensor.

As shown by the cross-sectional view 500 of FIG. 5, the method may begin with bonding together a partially manufactured image sensor 501 and a second IC device 503. Each of the image sensor 501 and the second IC device 503 may have been subjected to front-end-of-line (FEOL) and back-end-of-line (BEOL) processing. In the image sensor 501, FEOL processing provides photodetectors 126, the floating diffusion regions 123, and the transfer gates 122. BEOL processing provides the first metal interconnect 109. In the second IC device 503, FEOL processing provides the logic gates 113 and like structures and BEOL processing provides the second metal interconnect 110. Bonding occurs between the first metal interconnect 109 and the second metal interconnect 110. The bonding process may be fusion bonding, hybrid bonding, the like, or some other suitable bonding process.

Each of the first semiconductor substrate 107 and the second semiconductor substrate 111 may be or comprise a bulk silicon substrate, a silicon-on-insulator (SOI) substrate, the like, or some other suitable semiconductor substrate. Each of the first interlevel dielectric 120 and the second interlevel dielectric 117 may be or comprise silicon dioxide ($SiO_2$), a low-κ dielectric, an extremely low-κ dielectric, or the like. The first wires 121, the first vias 119, the second wires 115, and the second vias 118 may be or comprise copper (Cu), aluminum (Al), the like, or some other suitable metal. The photodetectors 126 may be any types of photodetectors. In some embodiments, the photodetectors 126 comprise photodiodes. In some embodiments, the photodetectors 126 are active-pixel sensors with pinned photodiodes.

Figure 6:
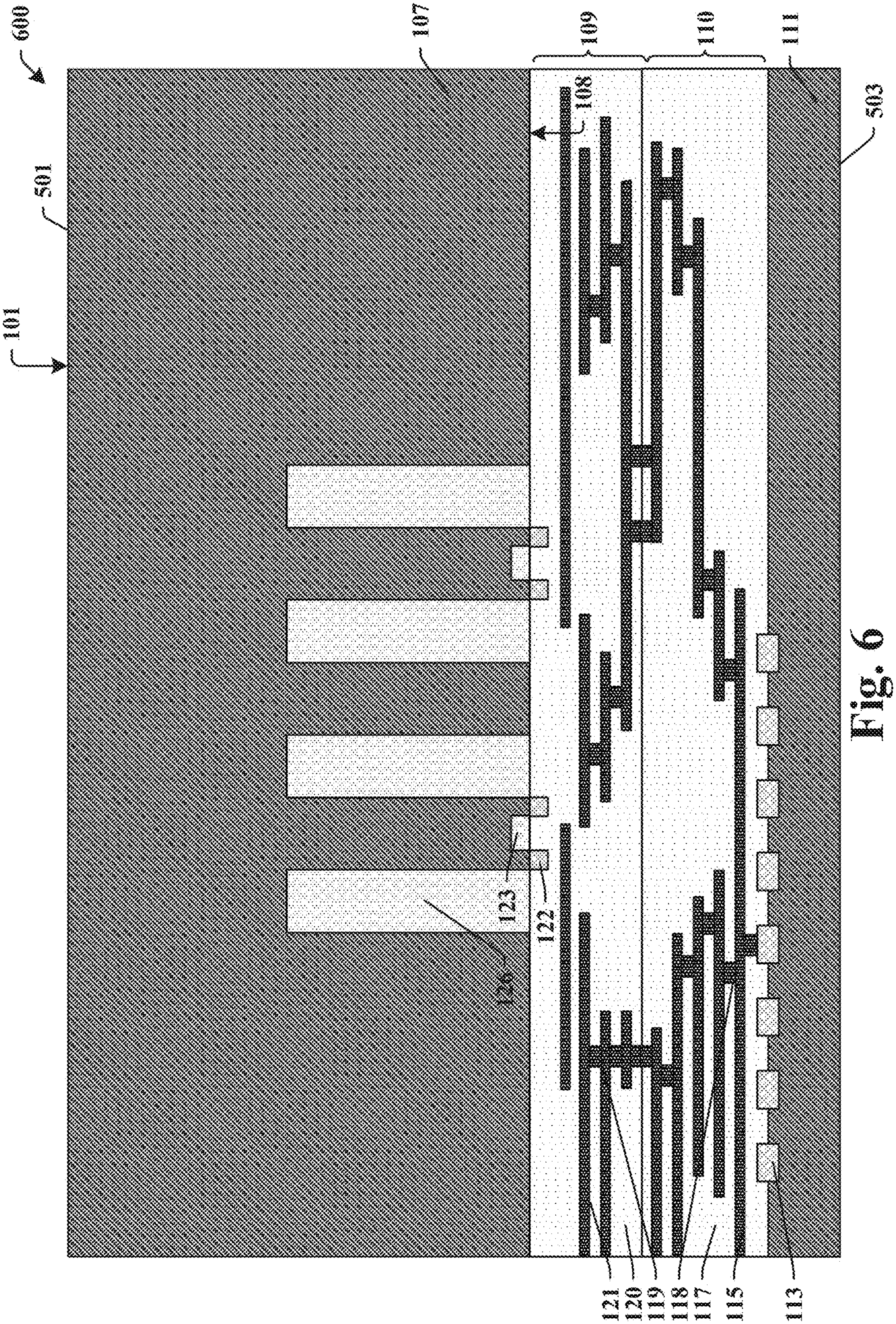

The cross-sectional view 600 of FIG. 6, shows the partially manufactured image sensor 501 and a second IC device 503 after bonding. The method may continue with thinning the first semiconductor substrate 105 as shown by the cross-sectional view 700 of FIG. 7.

Figure 8:
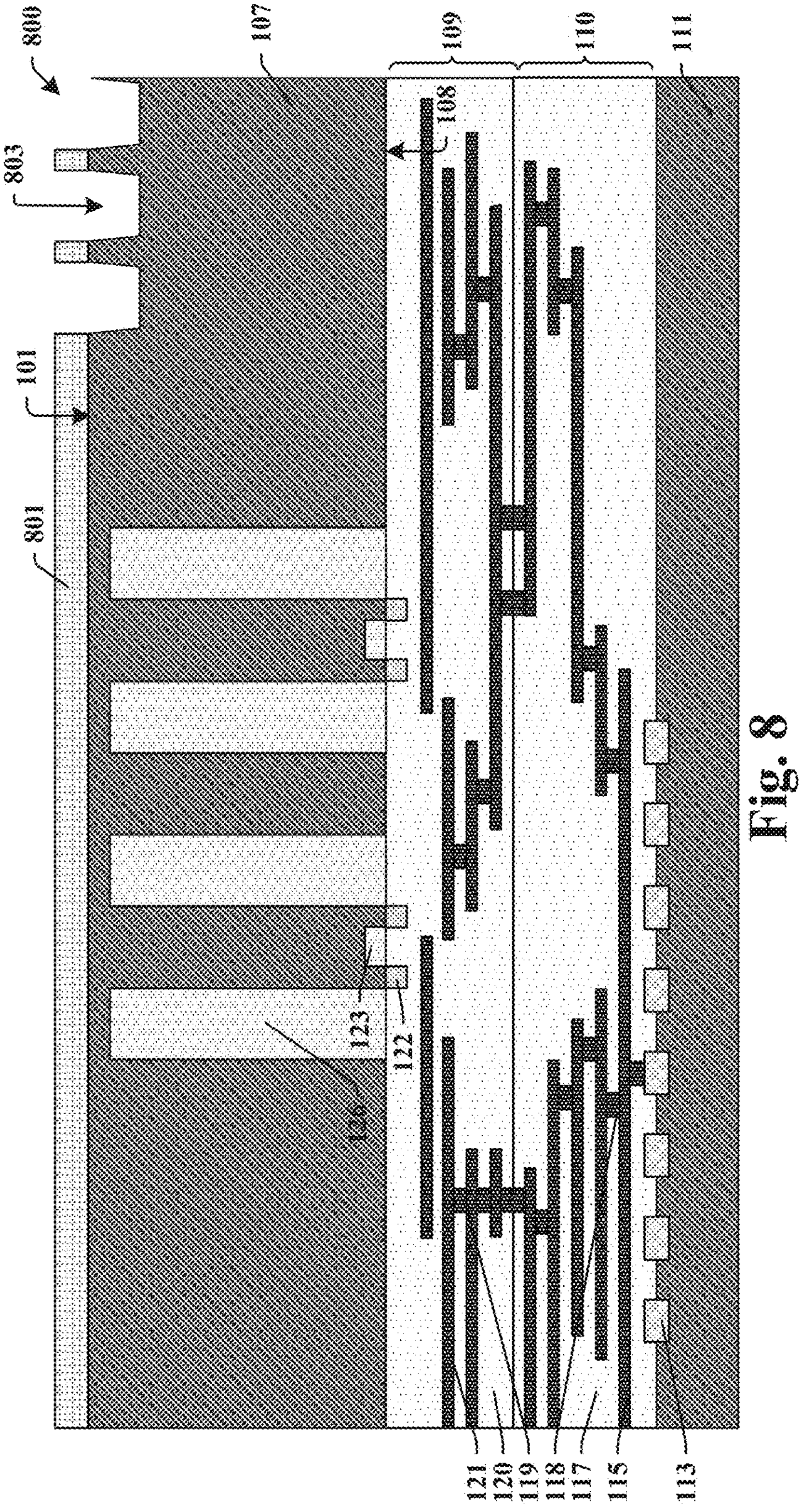
Figure 8A:
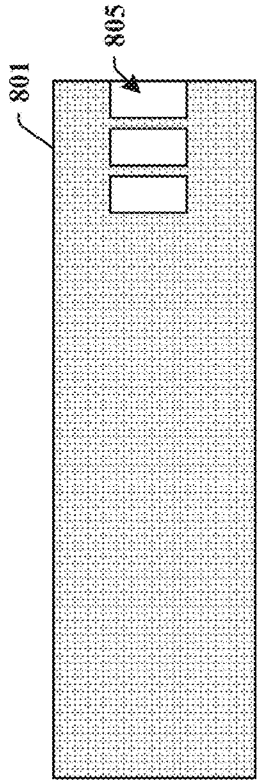
Figure 9:
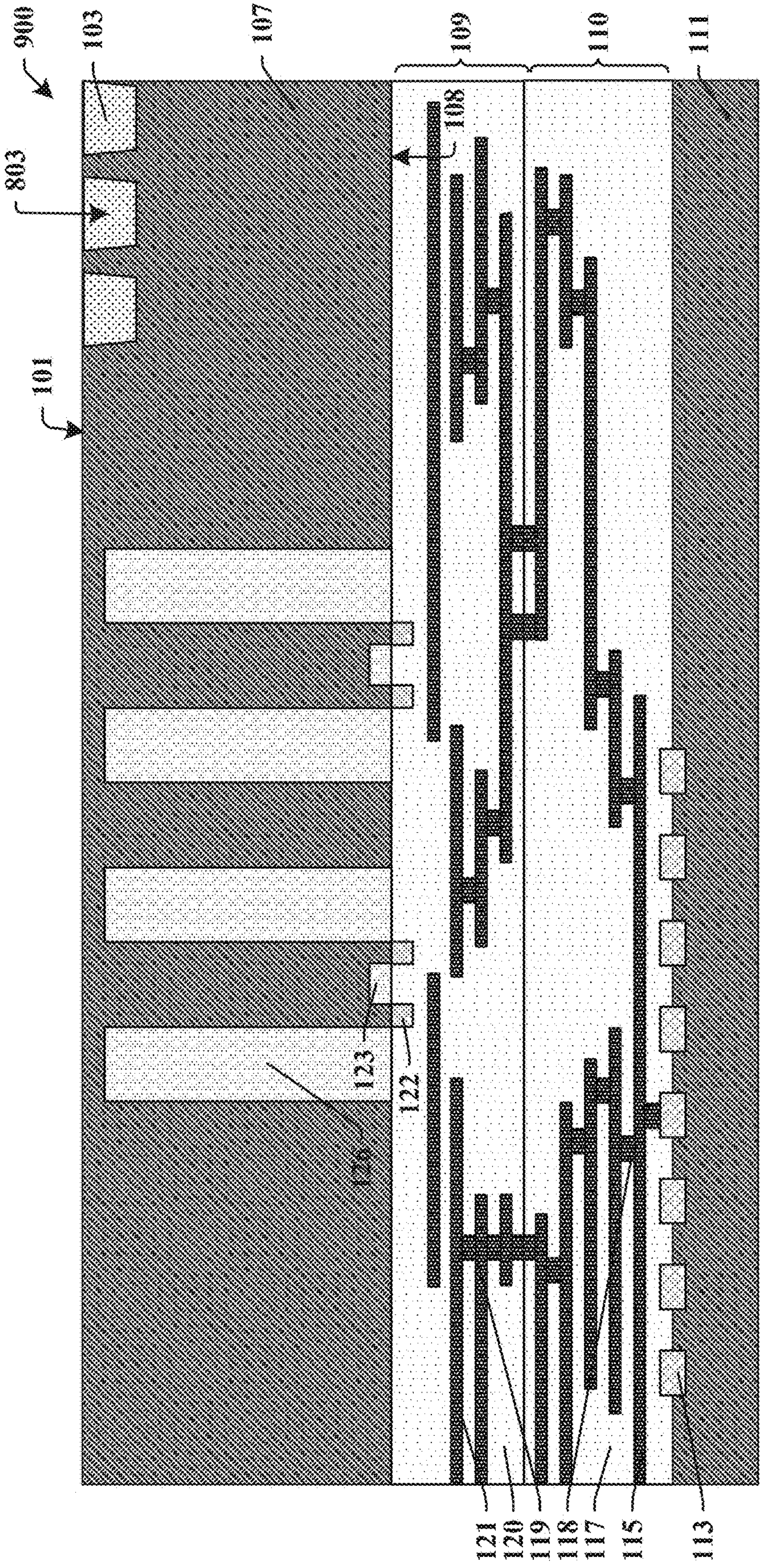

As shown by the cross-sectional view 800 of FIG. 8, a mask 801 may be formed and used to etch scribe line trenches 803 for the scribe lines 103 (see FIG. 1) in the back side 101 of the first semiconductor substrate 107. FIG. 8A illustrates the mask 801. As shown in FIG. 8A, the mask 801 has slits 805 that correspond to the scribe line trenches 803. As shown by the cross-sectional view 900 of FIG. 9, the mask 801 may be stripped and the scribe line trenches 803 filled to provide the scribe lines 103. Filling may involve deposition of the fill material followed by planarization. The deposition process may be, for example, chemical vapor deposition (CVD), physical vapor deposition (PVD), the like, or some other suitable process. The planarization process may be chemical mechanical polishing (CMP), the like, of some other suitable process. The fill material may be silicon oxide (SiO), the like, or some other suitable material.

Figure 10:
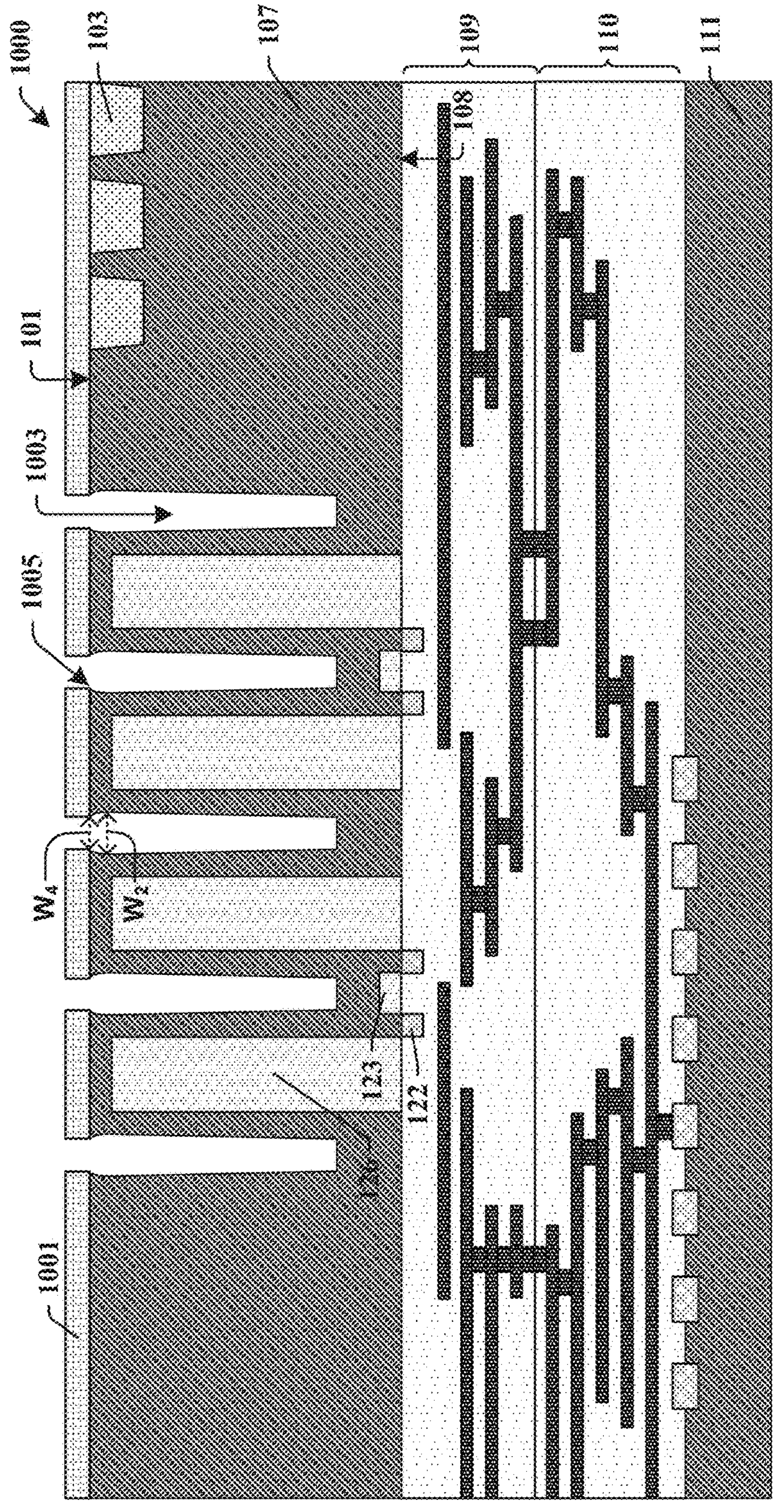
Figure 10A:
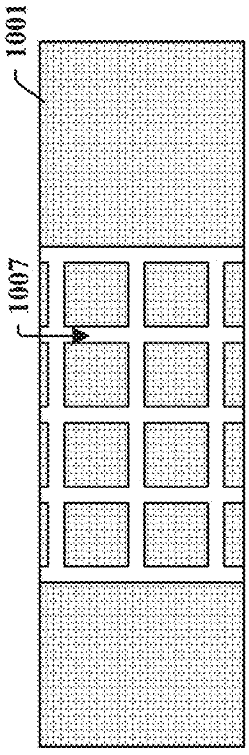

As shown by the cross-sectional view 1000 of FIG. 10, a mask 1001 may be formed and used to etch high aspect ratio trenches 1003 in the first semiconductor substrate 107. FIG. 10A illustrates a plan view the mask 1001. The mask 1001 has slits 1007 that form a grid pattern corresponding to the high aspect ratio trenches 1003. The high aspect ratio trenches 1003 may have a neck 1005 near the back side 101. Because of the neck 1005, the high aspect ratio trenches 1003 have a width $W_4$ at the top that is less than a width $W_2$ a short distance below the top. In some embodiments, the etch process comprises plasma etching or the like.

In some embodiments, the etch process is a multistep etch process in which the trenches are formed in segments. Forming a segment includes etching to a first depth followed by deposition of a protective layer on the trench sidewalls. The protective layer may be, for example, an oxide or a carbide. Etching for the next segment breaks through the protective layer at the bottoms of the trenches. The protective layer reduces lateral etching and trench widening in the upper segments as the lower segments are being formed. This type of etch process can form a higher aspect ratio trench than a single step etch process, but the etch conditions tend to leave the neck 1005 at the top.

Figure 11:
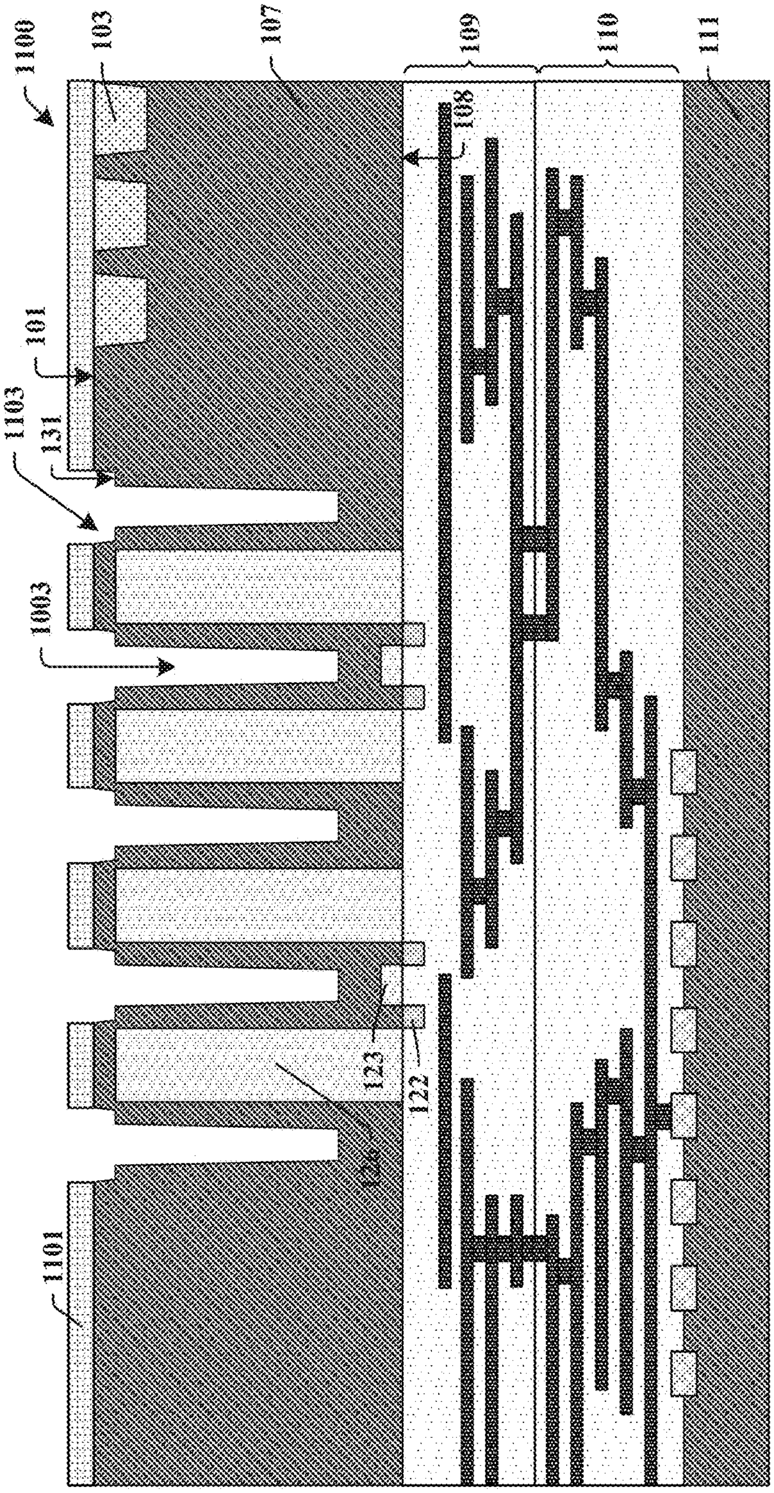
Figure 11A:
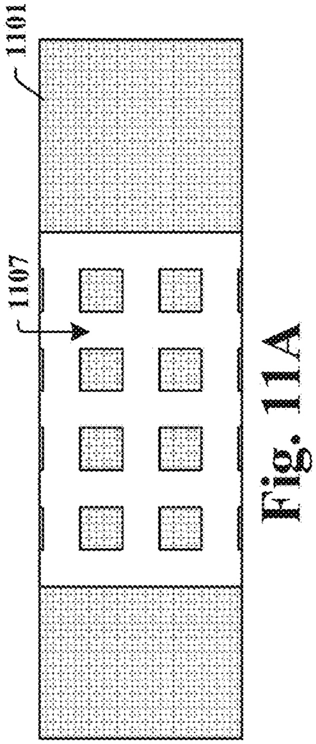

As shown by the cross-sectional view 1100 of FIG. 11, a mask 1101 is formed and used to etch trench mouths 1103 that adjoin the high aspect ratio trenches 1003. FIG. 11A illustrates a plan view of the mask 1101. The mask 1101 has slits 1107. The slits 1107 have the same grid pattern as the slits 1007 of the mask 1001 (see FIG. 10A) but are wider. Etching the trench mouths 1103 removes the necks 1005 (see FIG. 10). Etching the trench mouths 1103 may also somewhat deepen the high aspect ratio trenches 1003. The etch process may be a plasma etch, the like, or any other suitable etch process.

Figure 12:
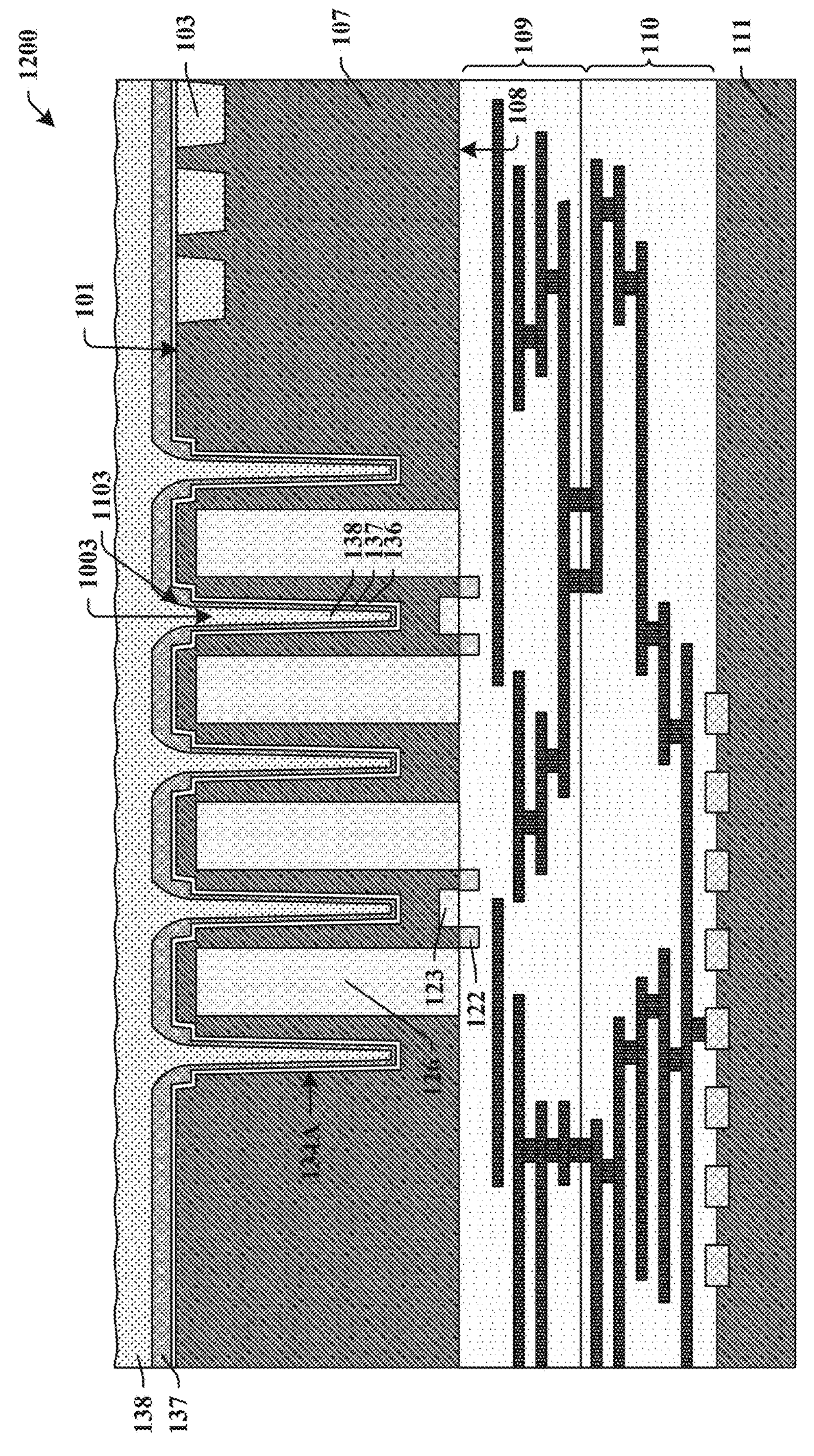

As shown by the cross-sectional view 1200 of FIG. 12, the dielectric liner 136, the intermediate passivation layer 137, and the upper passivation layer 138 may be sequentially deposited. These layers may fill the high aspect ratio trenches 1003 and the trench mouths 1103 to form the BDTI structure 134A. The dielectric liner 136 may include one or more layer which may be deposited by conformal deposition processes. The conformal deposition processes may be PVD, CVD, atomic layer deposition (ALD), the like, or other suitable processes.

The intermediate passivation layer 137 and the upper passivation layer 138 may be deposited by a non-conformal deposition process whereby these layers deposit more thickly on the back side 101 than within the high aspect ratio trenches 1003. The deposition processes may include PVD, CVD, the like, or any other suitable processes. In some embodiments, the upper passivation layer 138 is deposited to a thickness in the range from about 500 Angstroms to about 2000 Angstroms, e.g., about 1000 Angstroms.

Figure 13:
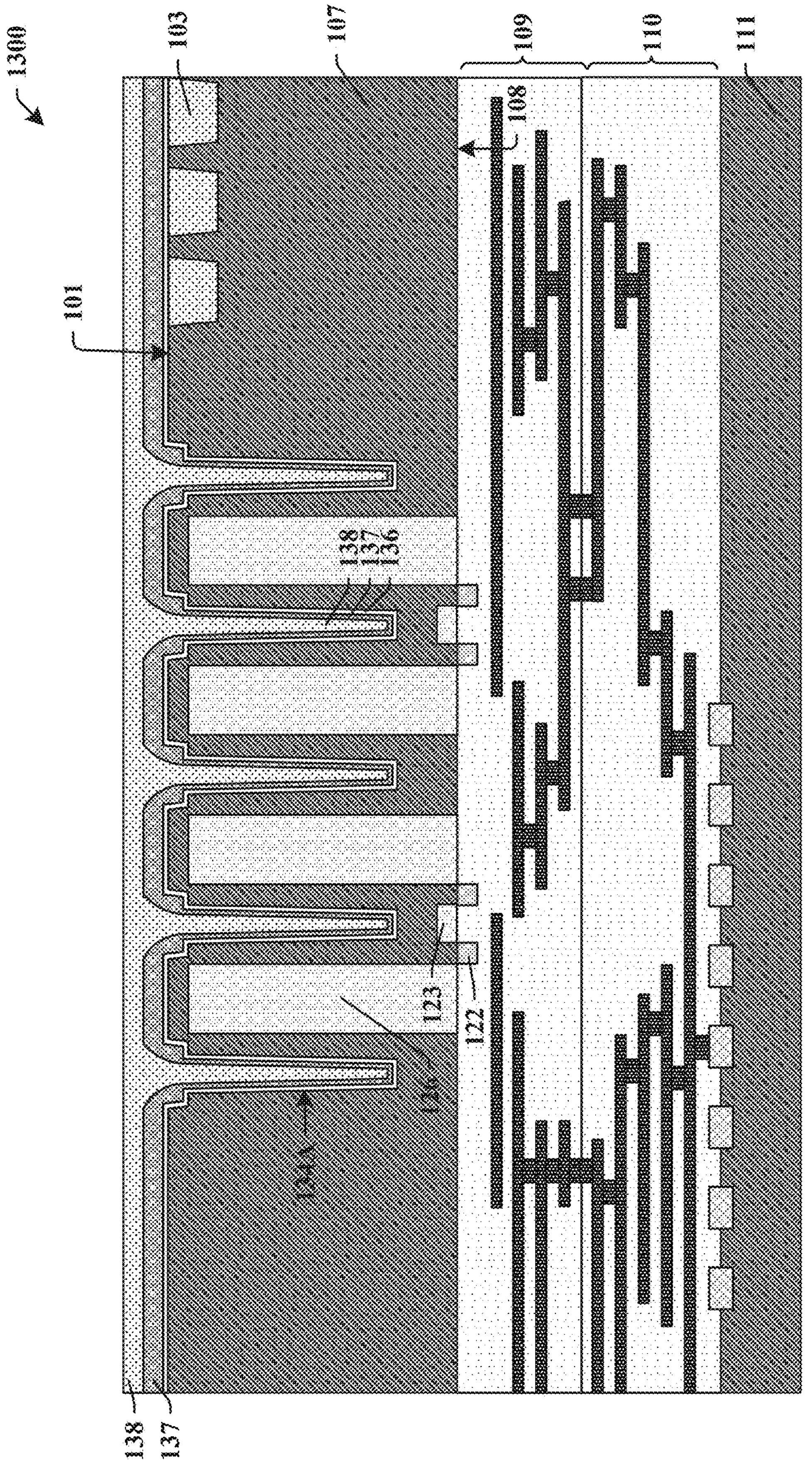

As shown by the cross-sectional view 1300 of FIG. 13, a planarization process may be carried out to thin and planarize the upper passivation layer 138. The planarization process may be CMP, the like, or some other suitable process.

Figure 14:
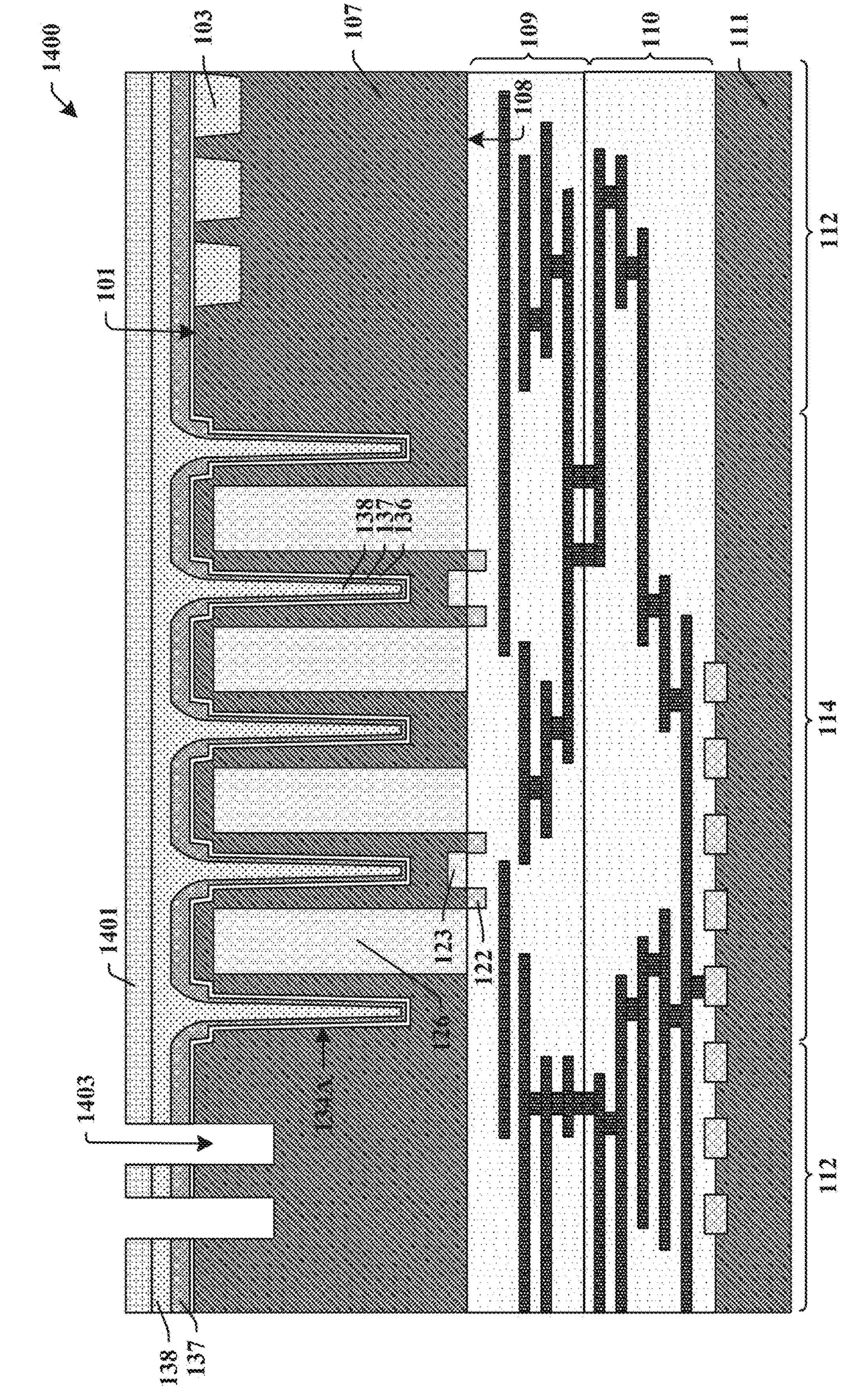

As shown by the cross-sectional view 1400 of FIG. 14, a mask 1401 may be formed and used to etch ground bar openings 1403 in the first semiconductor substrate 107 within the peripheral area 112. The etch process may be a plasma etch or the like. After etching, the mask 1401 may be stripped.

Figure 15:
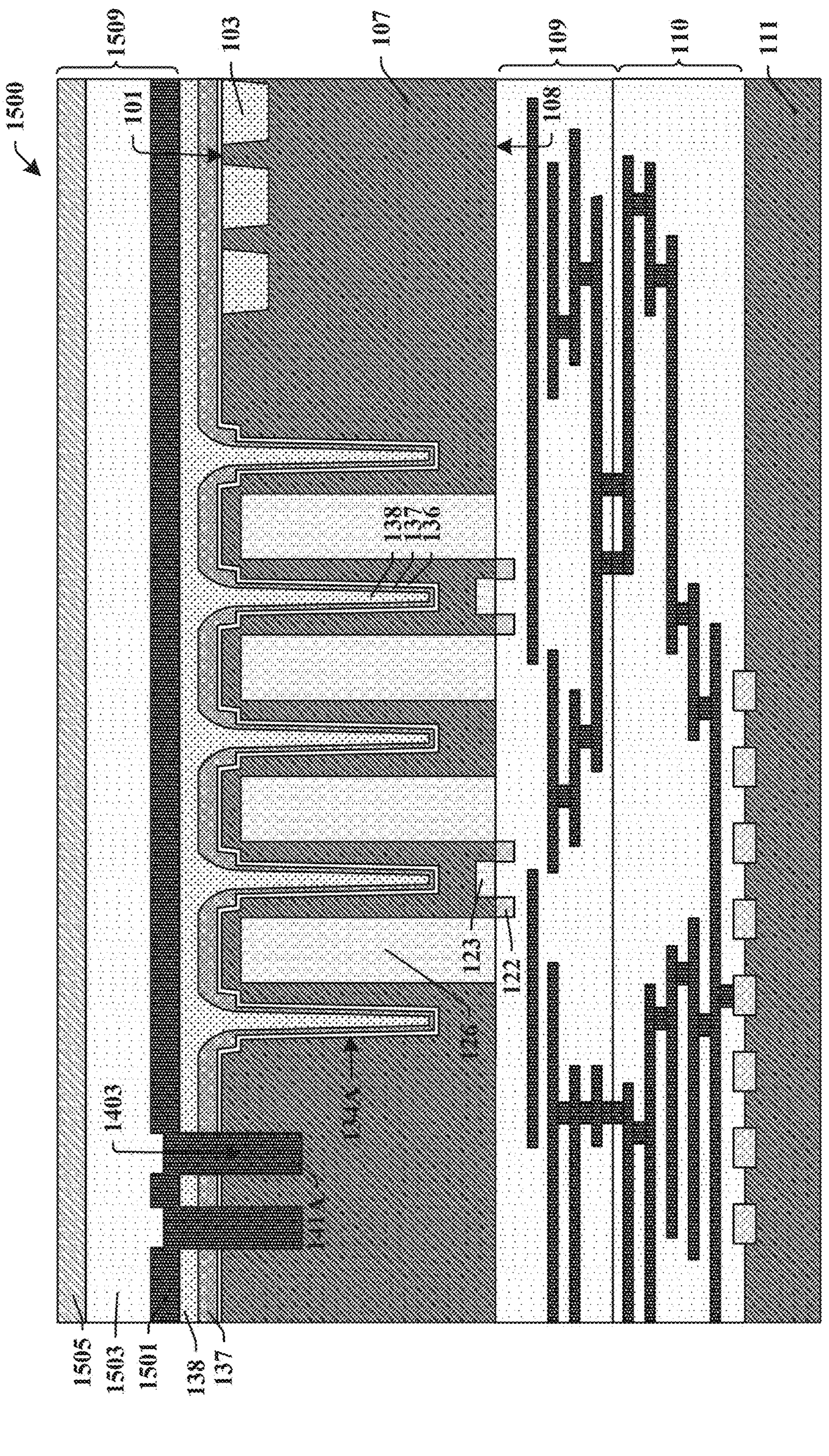

As shown by the cross-sectional view 1500 of FIG. 15, a composite grid stack 1509 may be deposited over the structure shown by the cross-sectional view 1400 of FIG. 14. The composite grid stack 1509 may include a metal layer 1501, a dielectric layer 1503, and a hard mask layer 1505. The metal layer 1501 fills the ground bar openings 1403 to form the ground bars 141A. The metal layer 1501 may comprise any suitable metal or combination of metals. In some embodiments, the metal layer 1501 is or comprises tungsten (W), or the like. In some embodiments, the metal layer 1501 includes a liner layer of titanium nitride (TiN), tantalum nitride (TaN), or the like. The dielectric layer 1503 may be silicon oxide (SiO), the like, or any suitable dielectric. The hard mask layer 1505 may be a nitride, a carbide, the like, a combination thereof, or any other suitable hard mask material. These layers may be deposited by a combination of ALD, CVD, PVD, electroplating, electroless plating, the like, or any other suitable processes.

Figure 16:
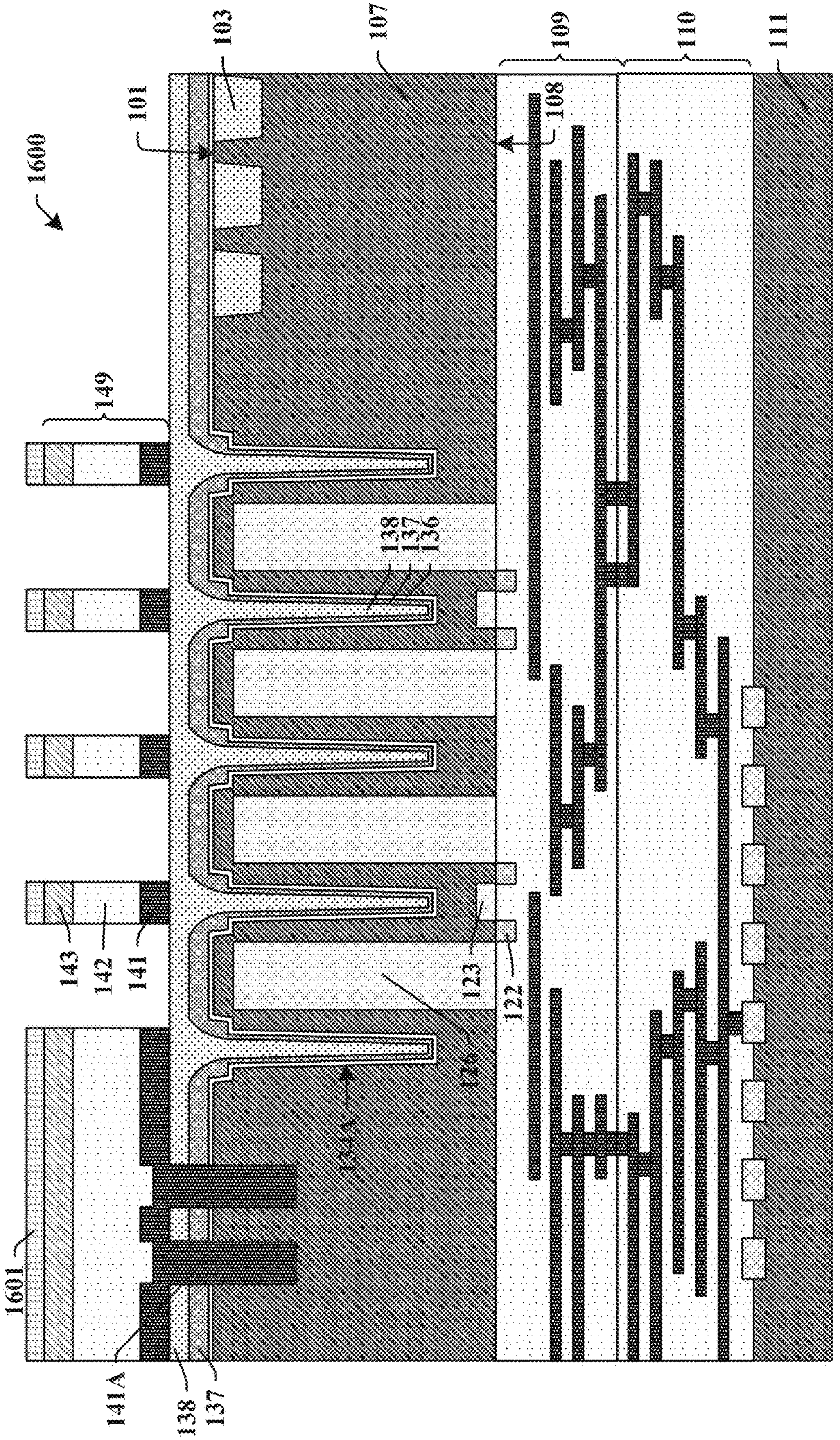

As shown by the cross-sectional view 1600 of FIG. 16, a mask 1601 may be formed and used to etch the composite grid 149 from the composite grid stack 1509. The etching removes the composite grid from over the photodetectors 126. The etching forms the back side metal grid 141 from the metal layer 1501, the dielectric grid 142 from the dielectric layer 1503, and the hard mask grid 143 from the hard mask layer 1505. After this etching, the mask 1601 may be stripped.

Figure 17:
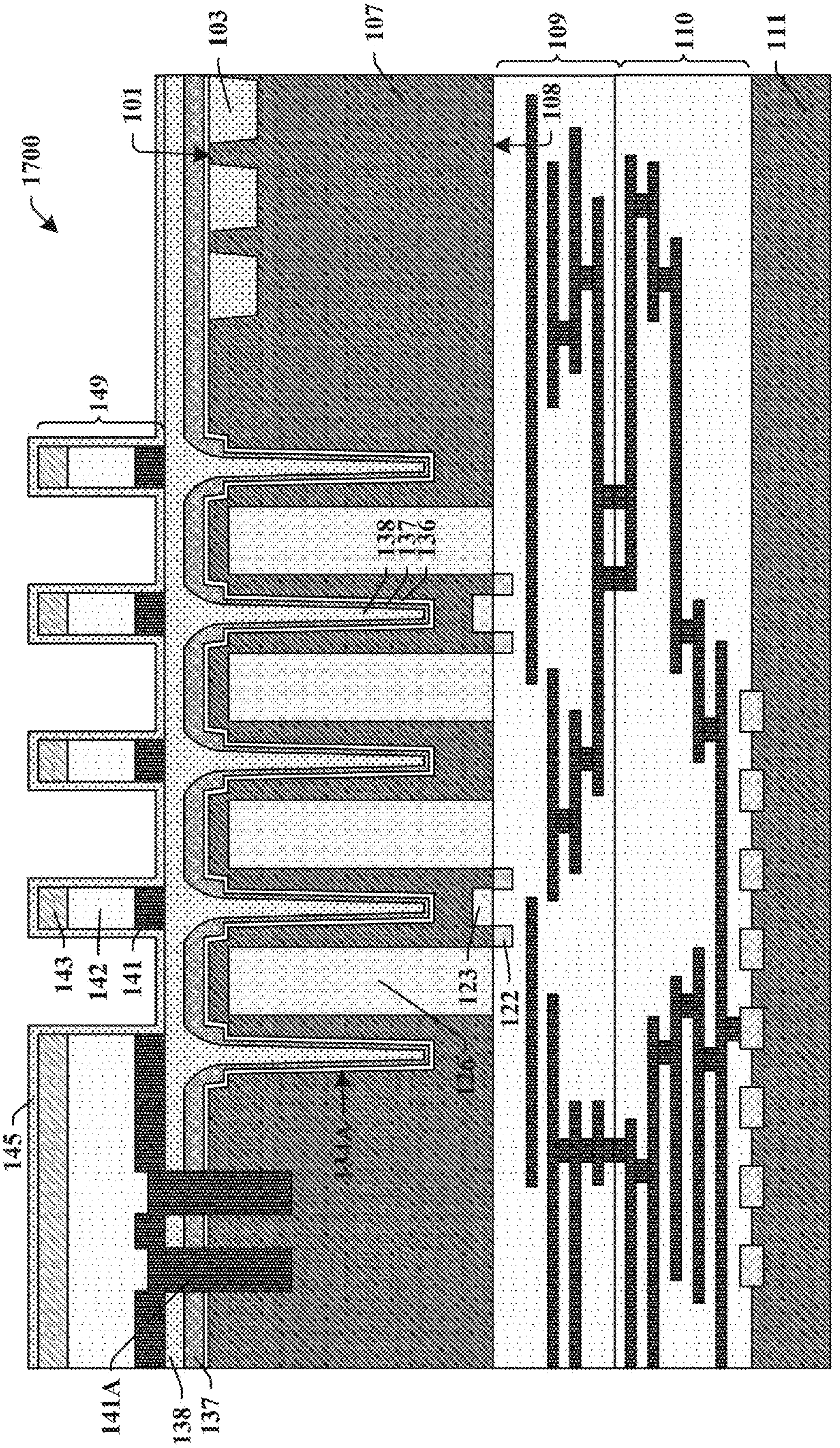

As shown by the cross-sectional view 1700 of FIG. 17, an encapsulation layer 145 may be formed over the structure illustrated by the cross-sectional view 1600 of FIG. 16. The encapsulation layer 145 may be an oxide, the like, or some other suitable dielectric. Color filters 146 may then be formed within the composite grid 149 over the photodetectors 126. Micro-lenses 147 may be formed over the color filters 146 to produce an image sensor such as the image sensor 100A of FIG. 1.

Figure 18A:
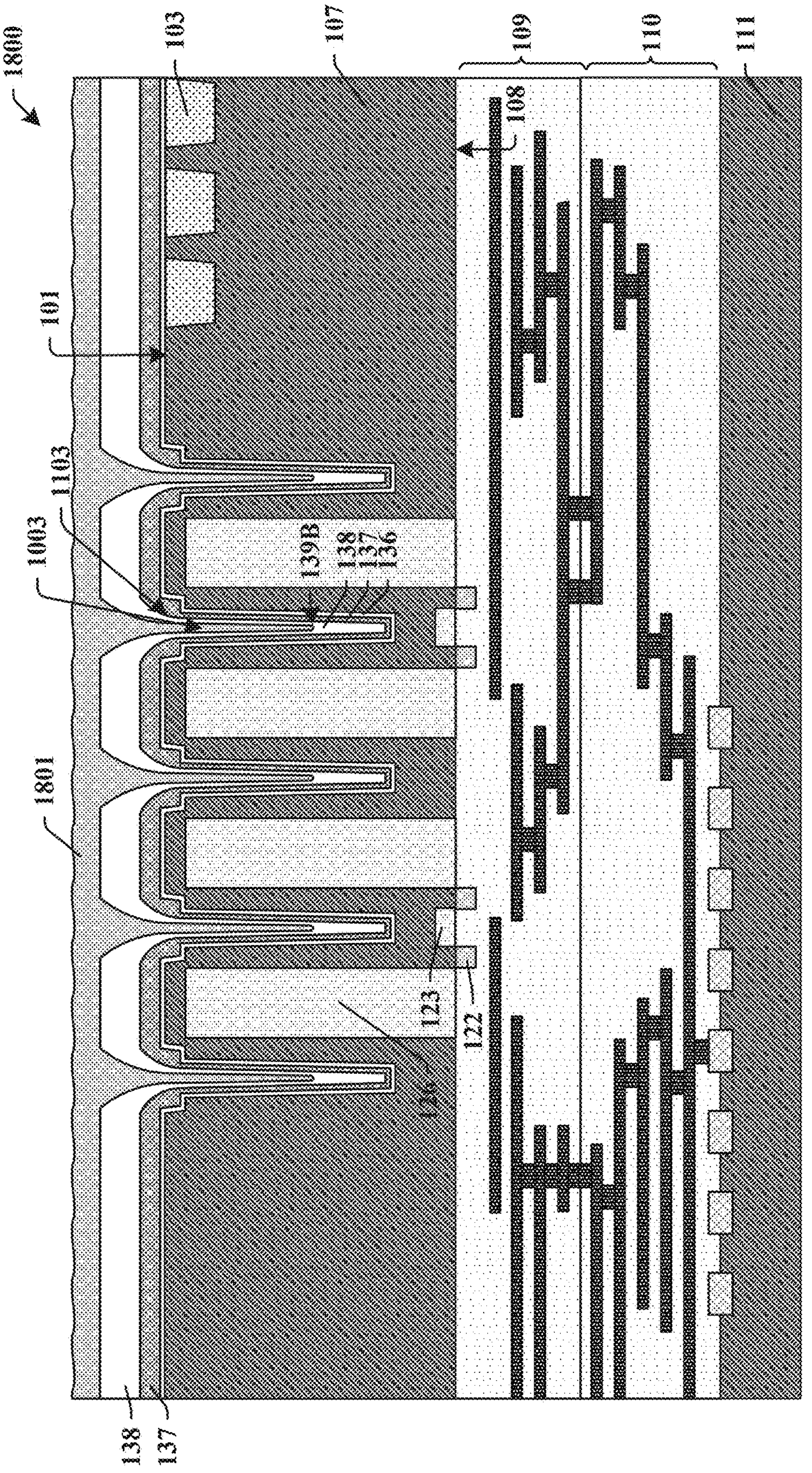
FIGS. 18A-18B illustrate a variation on the process of FIGS. 5-17 in accordance with some embodiments.
Figure 18B:
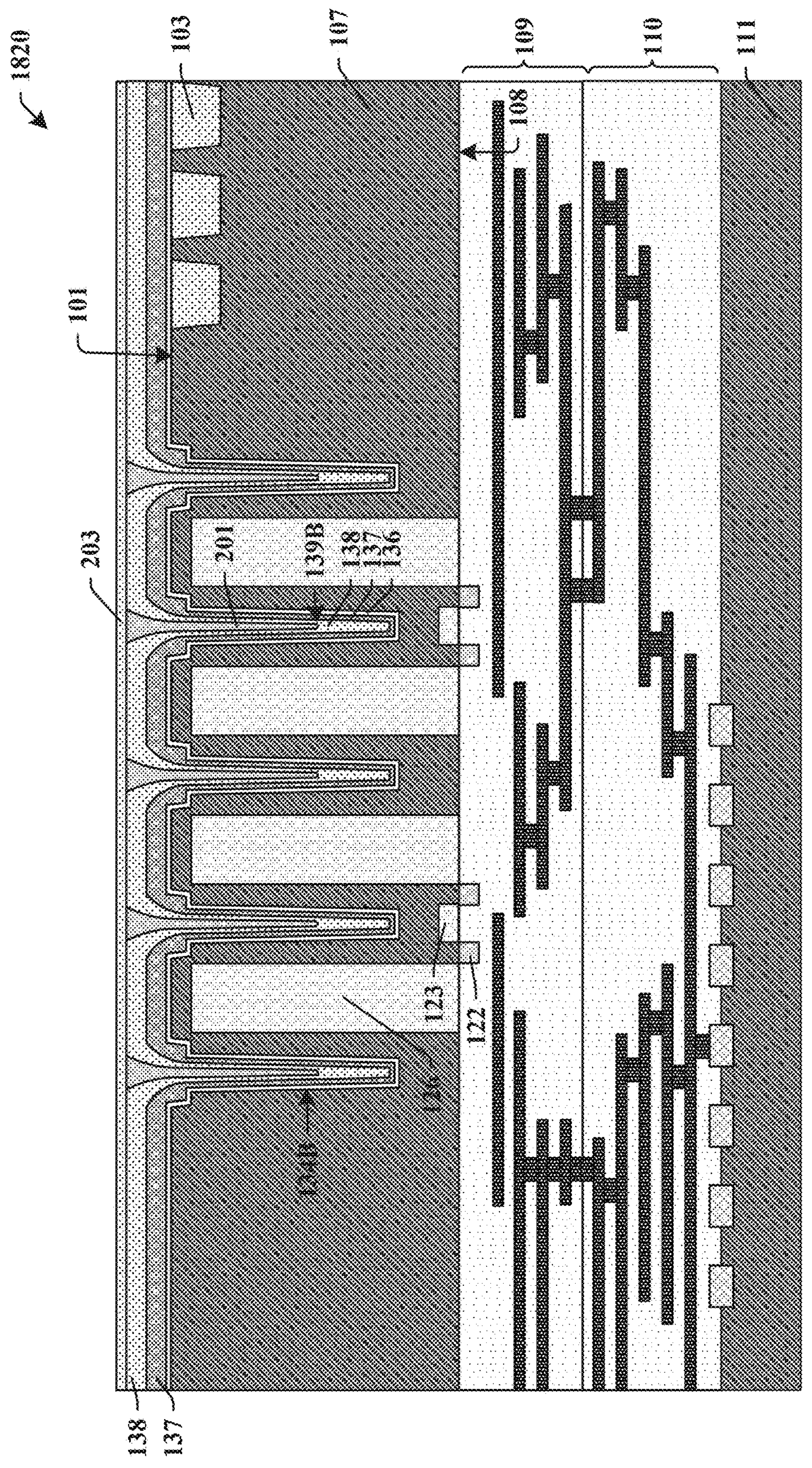

FIGS. 18A-18B illustrate a variation of the process of FIGS. 5-17 that may be used to produce the image sensor 100B of FIG. 2. As shown by the cross-sectional view 1800 of FIG. 18A, in this variation the processes of depositing the intermediate passivation layer 137 and the upper passivation layer are carried out in such a way that the high aspect ratio trenches 1003 and the trench mouths 1103 and not filled by these layers. The fill process is completed by depositing a metal 1801. The metal 1801 may be deposited by PVD, CVD, ALD, electroplating, electroless plating, the like, or any other suitable process. The process may be adapted to fill high aspect ratio openings without creating voids.

As shown by the cross-sectional view 1820 of FIG. 18B, a planarization process may be carried out to define the substrate-embedded metal grid 201 from the metal 1801. The planarization process may be CMP, the like, or some other suitable process. The planarization process may thin the upper passivation layer 138 and results the BDTI structure 134B. After planarization, the dielectric layer 203 may be formed by CVD, PVD, ALD, the like, or some other suitable deposition process.

Figure 19:
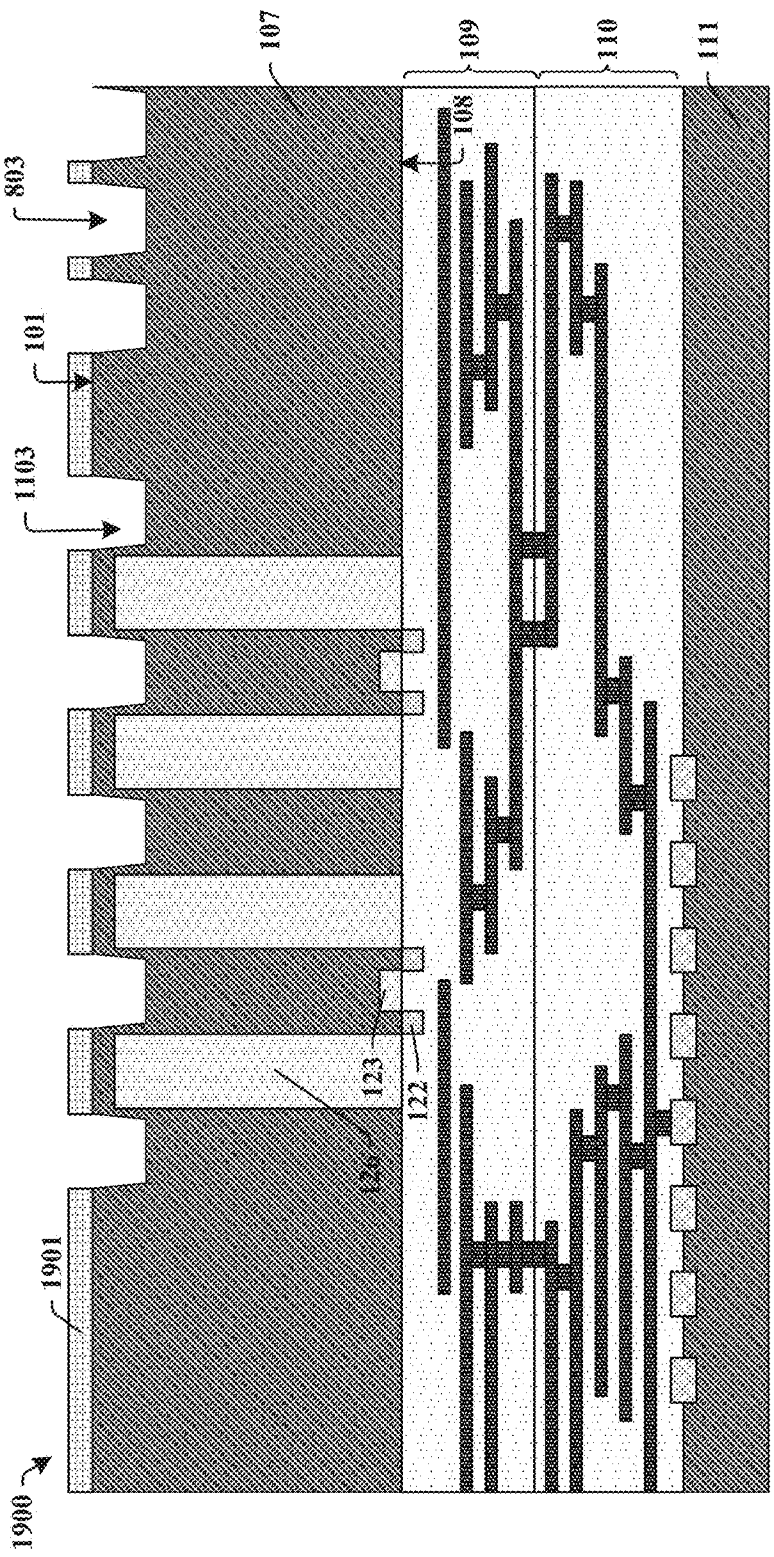
FIGS. 19, 19A, 20, and 20A illustrate a variation on the process of FIGS. 5-17 in accordance with some other embodiments.
Figure 19A:
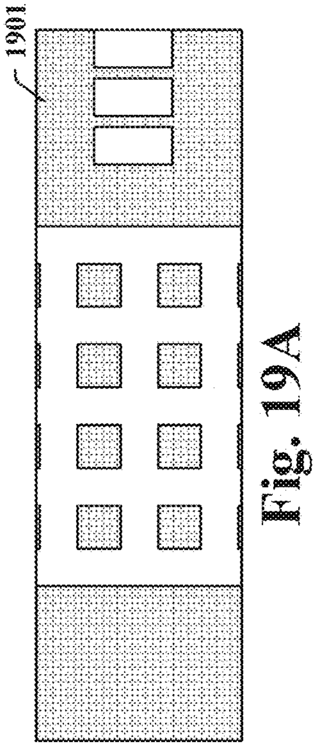
Figure 20:
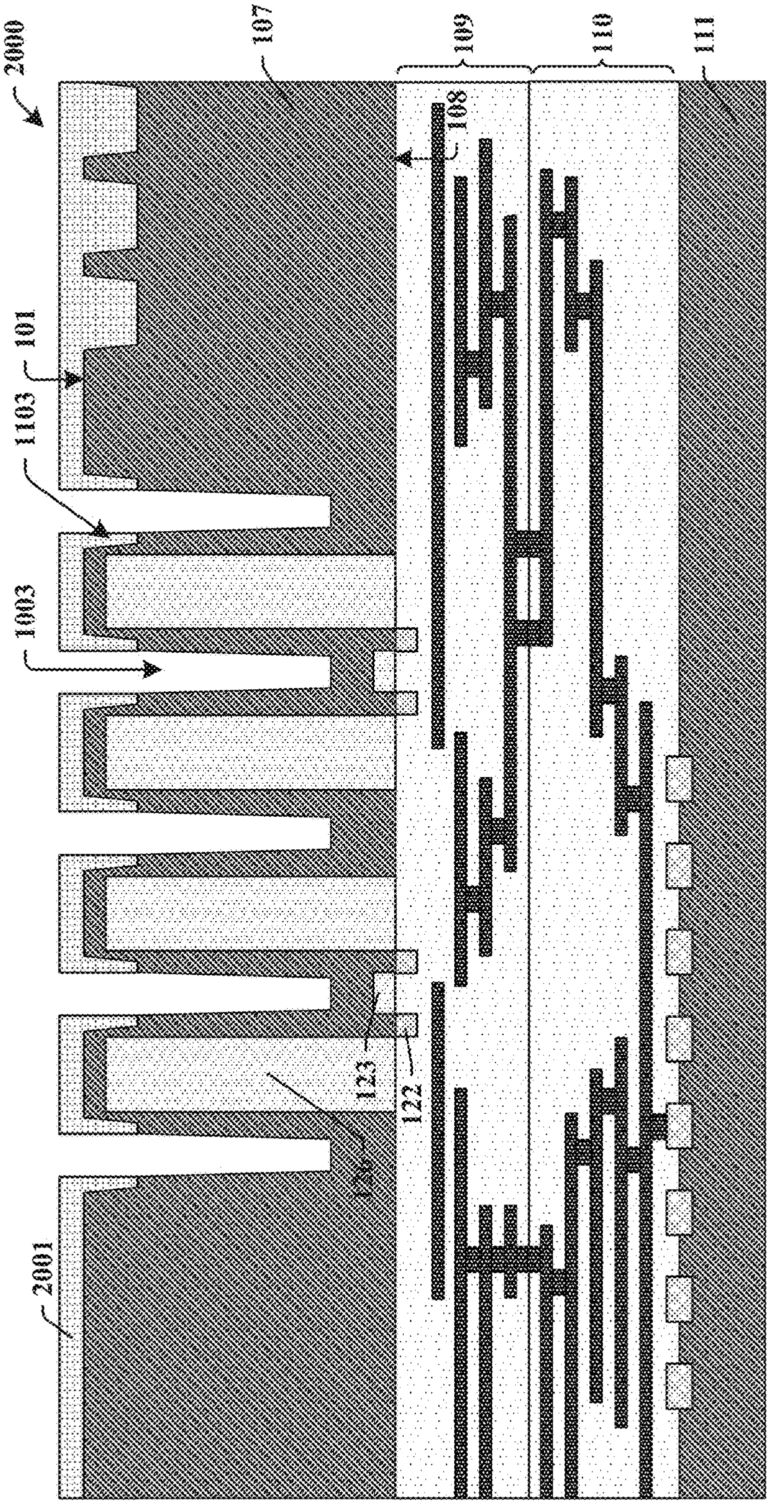

FIGS. 19-20 illustrate a variation on the process of FIGS. 5-17 that may be used to produce the image sensor 100C of FIG. 3. The processes of FIGS. 19 and 20 replace the processes of FIGS. 8-11. As shown by the cross-sectional view 1900 of FIG. 19, a mask 1901 is formed and used to etch the trench mouths 1103 and the scribe line trenches 803. FIG. 19A illustrates a plan view of the mask 1901.

Figure 20A:
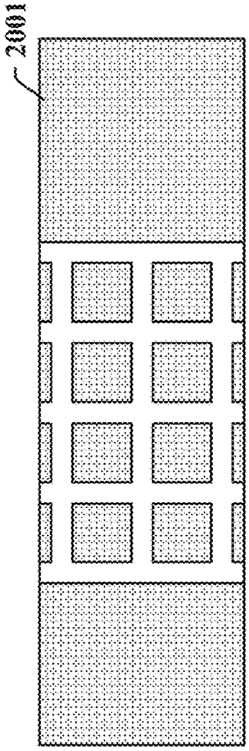

As shown by the cross-sectional view 2000 of FIG. 20, after stripping the mask 1901, a mask 2001 is formed and used to etch the high aspect ratio trenches 1003 through the trench mouths 1103. FIG. 20A illustrates a plan view of the mask 2001. The etch process may be selected so as to be of a type that does not form necks 1005 (see FIG. 10) at the tops of the high aspect ratio trenches 1003. After stripping the mask 2001, the process may continue as shown in FIGS. 12-17 to produce the image sensor 100C of FIG. 3.

Figure 21:
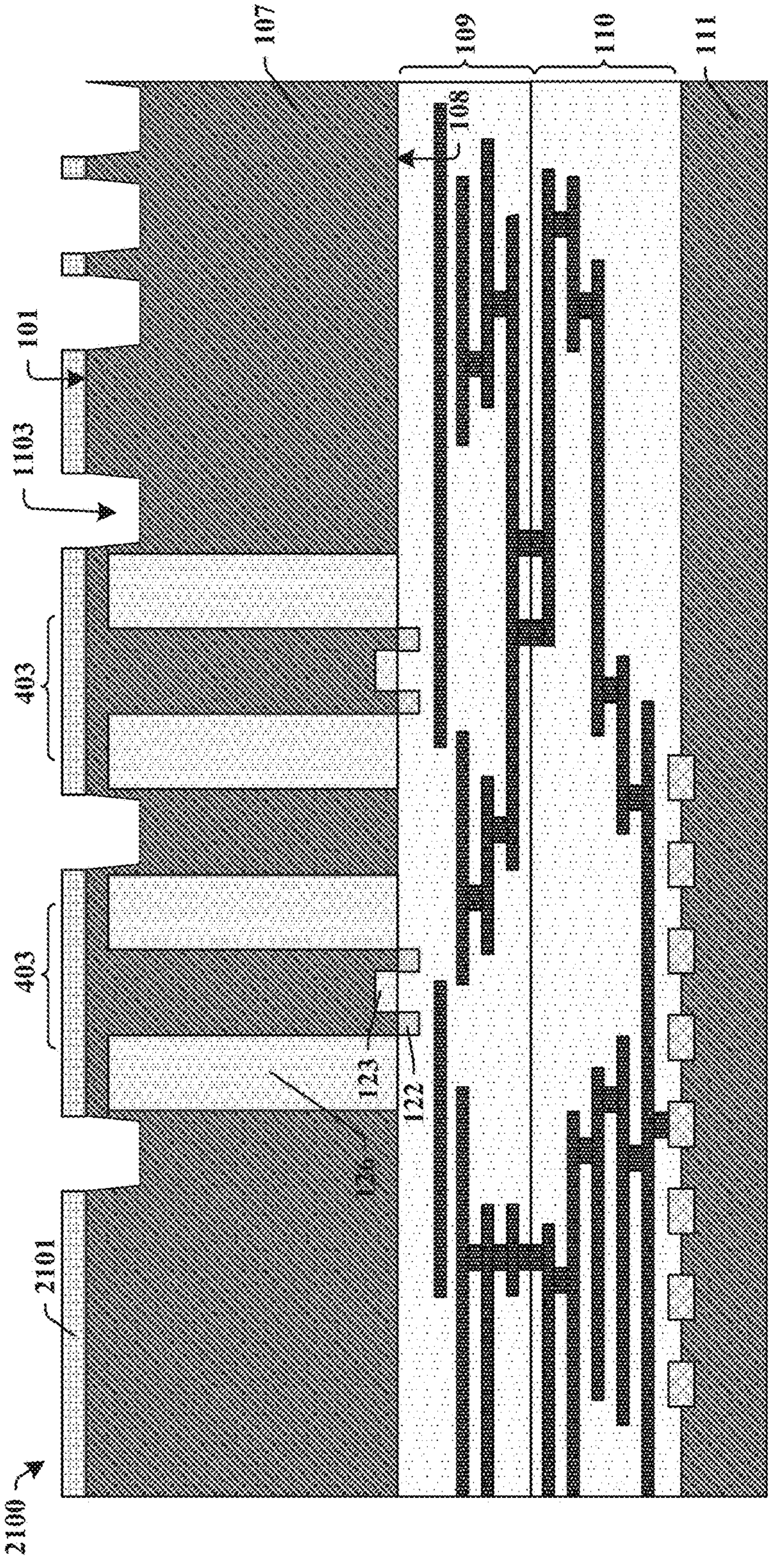
FIGS. 21, 21A, and 22 illustrate a variation on the process of FIGS. 5-17 in accordance with some other embodiments.
Figure 21A:
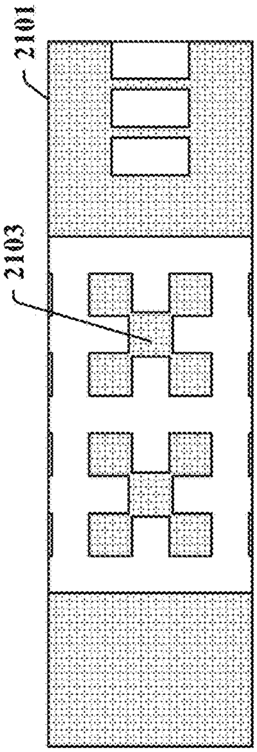
Figure 22:
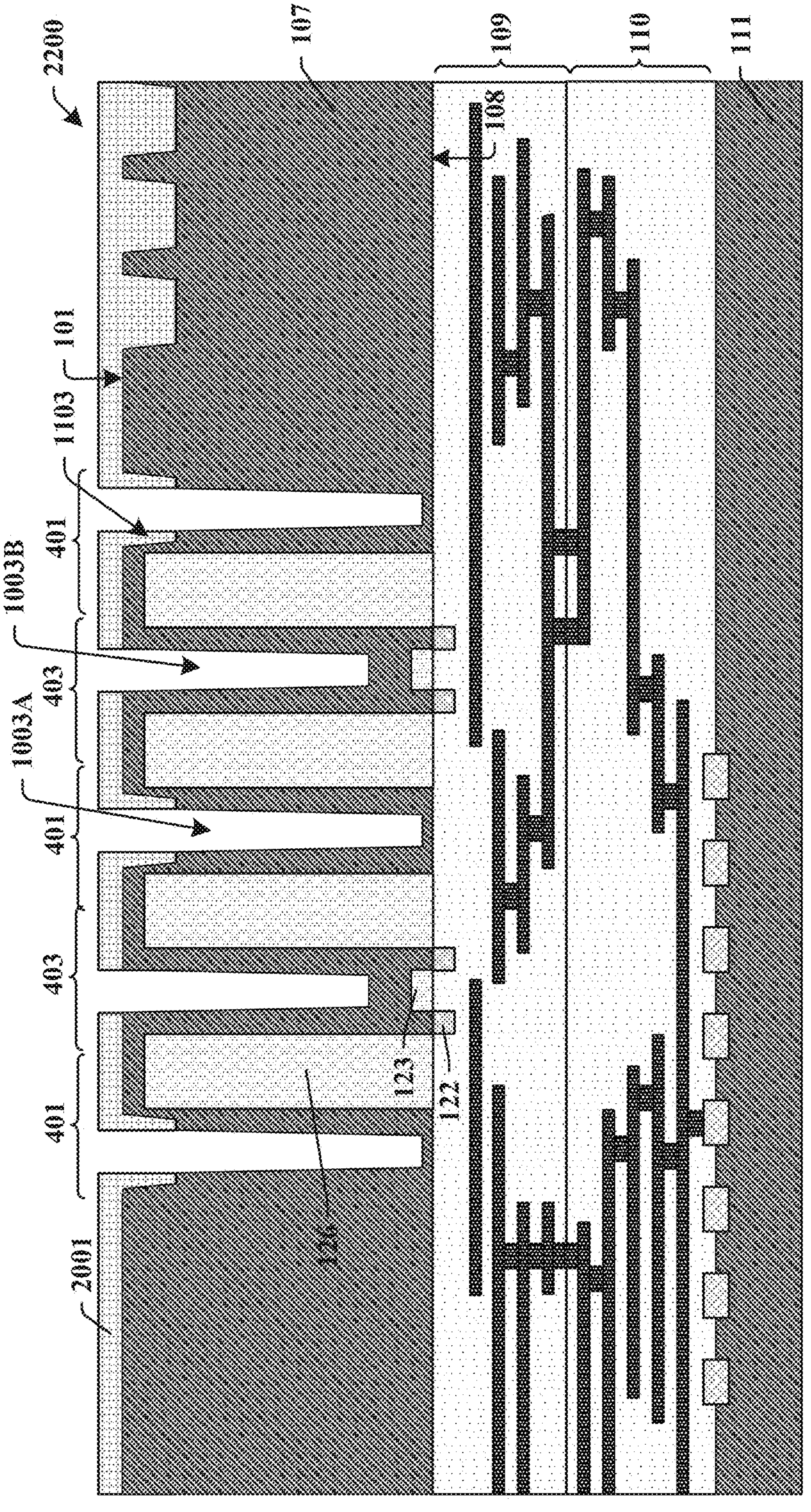

FIGS. 21-22 illustrate a variation on the process of FIGS. 19-20 that may be used to produce the image sensor 100D of FIG. 4. This variation etches the trench mouths 1103 using a mask 2101 illustrated in FIG. 21A. The mask 2101 is like the mask 2109 of FIG. 19A except that the mask 2101 includes the blocks 2103. As shown by the cross-sectional view 2100 of FIG. 21, the blocks 2103 prevent the trench mouths 1103 from being formed in second areas 403.

As shown by the cross-sectional view 2200 of FIG. 22, when etching is then carried out using the mask 2001 (see FIG. 20A), the high aspect ratio trenches 1003A that form in first areas 401 are deeper than the high aspect ratio trenches 1003B that form in second areas 403. Continuing processing as shown in FIGS. 12-17 results in the image sensor 100D of FIG. 4.

Figure 23:
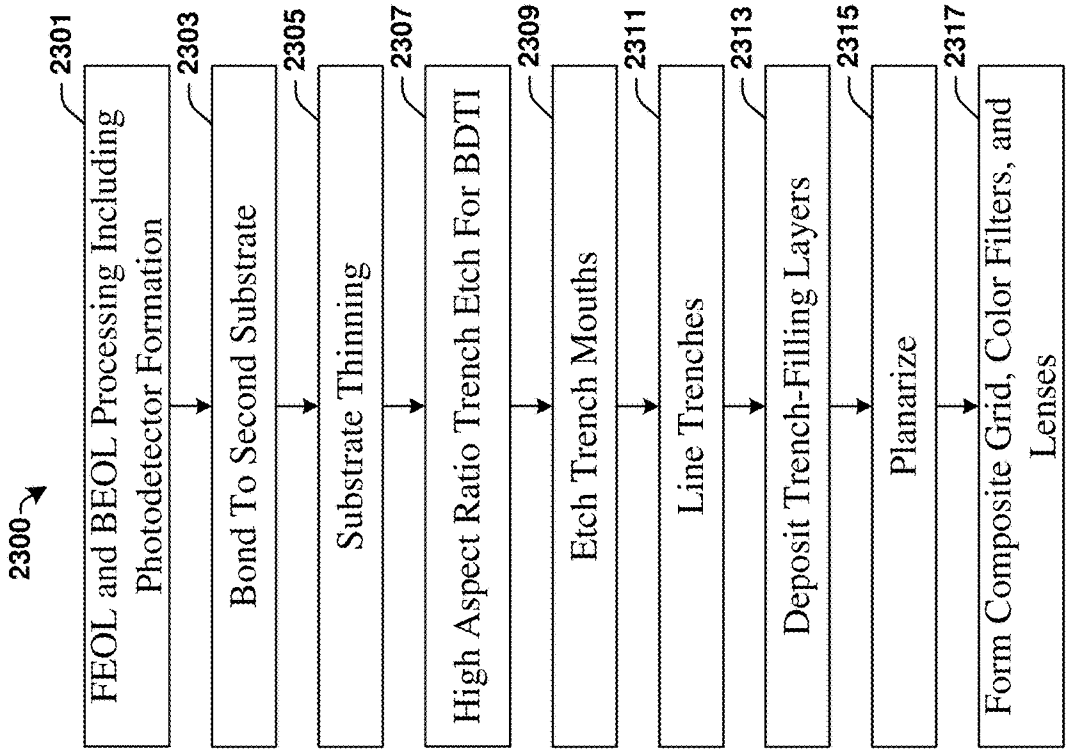
FIGS. 23-24 are flow chart of manufacturing processes according to some embodiments of the present disclosure.

FIG. 23 presents a flow chart for a process 2300 according to the present disclosure that may be used to form an image sensor according to the present disclosure. While the process 2300 of FIG. 23 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts are required to implement one or more aspects or embodiments of the description herein, and one or more of the acts depicted herein may be carried out in one or more separate acts and/or phases.

The process 2300 begins with act 2301, which is FEOL and BEOL processing. FEOL processing forms photodetectors in the first semiconductor substrate. BEOL processing forms a metal interconnect on the first semiconductor substrate. The image sensor 501 of FIG. 5, provides an example of the resulting structure.

Figure 7:
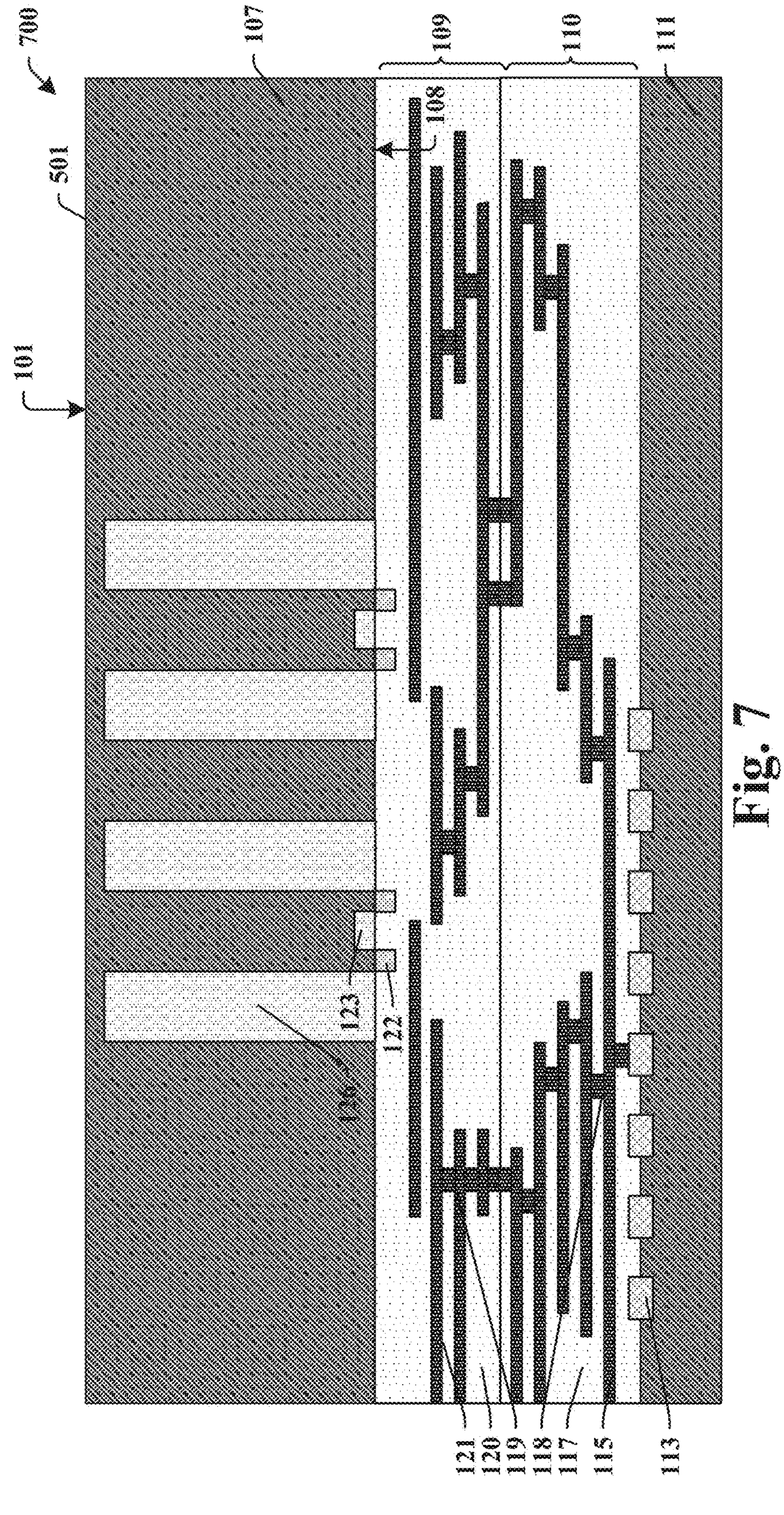

Act 2303 is bonding the first semiconductor substrate to a second semiconductor substrate. FIGS. 5 and 6 illustrate this process. The process continues with act 2305, thinning the first semiconductor substrate from the back side. FIG. 7 provides an example. The second semiconductor substrate provides structural integrity through the thinning process.

Act 2307 is etching high aspect ratio trenches in the back side for a BDTI structure. The cross-sectional view 1000 of FIG. 10 provides an example. The trenches extend into the semiconductor substrate in the image sensing area to laterally surround the photodetectors.

Act 2309 is etching to create trench mouths. The trench mouths are widened areas at the tops of the high aspect ratio trenches formed in act 2307. The cross-sectional view 1100 of FIG. 11 provides an example.

Act 2311 is forming a dielectric liner for the BDTI trenches. Act 2313 is filling the BDTI trenches. The cross-sectional view 1200 of FIG. 12 provides an example. The cross-sectional view 1800 of FIG. 18A provides another example. The trench fill may include one or more passivation layer and optionally a metal layer that forms a metal grid that is embedded in the substrate and forms part of the BDTI structure.

Act 2315 is planarization. The cross-sectional views 1300 of FIG. 13 and 1820 of FIG. 18B provide examples. Act 2317 is forming a composite grid, color filters, and lenses on the back side. The cross-sectional views 1500 to 1700 of FIGS. 15-17 together with FIG. 1 provide an example.

Figure 24:
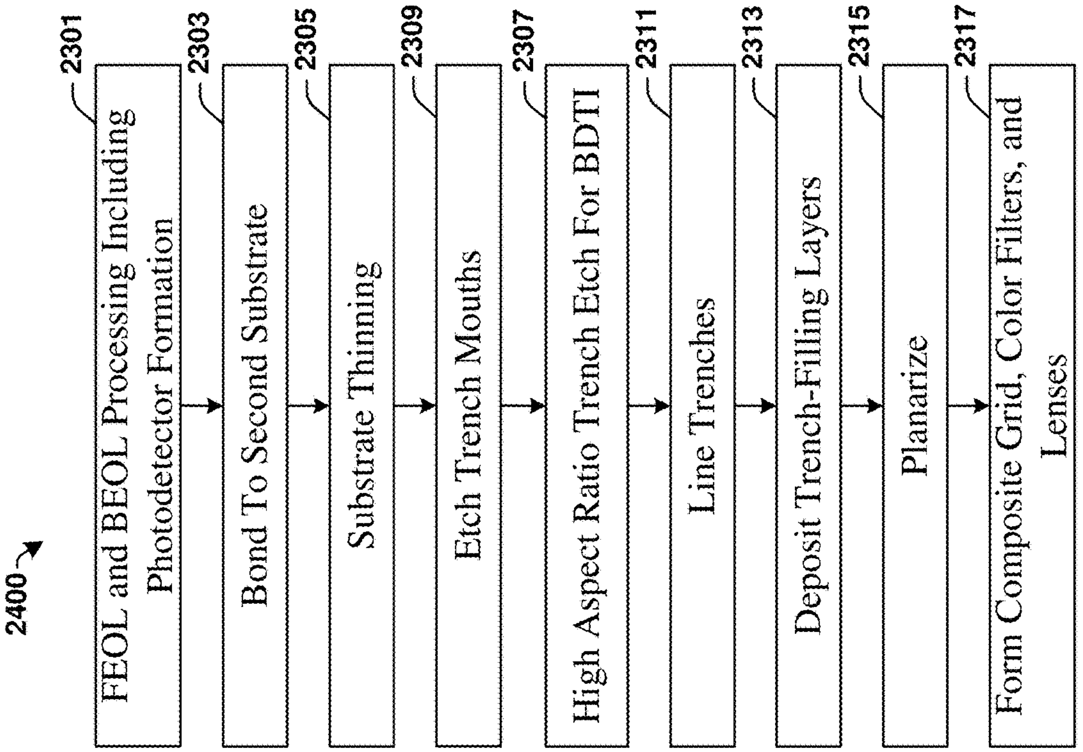

FIG. 24 provides a flow chat of a process 2400 that is like the process 2300 of FIG. 23 except that the act 2309, etching the trench mouths, is performed before act 2311, etching the high aspect ratio trenches. Trenches for scribe lines may be formed by the etch that forms the trench mouths. The cross-sectional views 1900 and 2100 of FIGS. 19 and 21 provide examples. The trench mouths may be formed in only a portion of the areas in which the BDTI structure is formed. The cross-sectional view 2100 of FIG. 21 provides an example. The BDTI structure will be shallower in the areas where the trench mouths were not formed. The cross-sectional view 2200 of FIG. 22 provides an example.

Some aspects of the present disclosure relate to an image sensor that includes photodetectors within a semiconductor substrate. A back side deep trench isolation structure extends into the back side of the semiconductor substrate to laterally surround the photodetectors. Within a first area, the back side deep trench isolation structure exhibits a step change in width within the semiconductor substrate. In some embodiments, within a second area the back side deep trench isolation structure is shallower than in the first area and does not exhibit the step change in width. In some embodiments the image sensor includes scribe lines having a depth corresponding to a depth at which the step change in width occurs. In some embodiments, the one or more passivation layers comprise an upper passivation and an intermediate passivation layer. The intermediate passivation layer is between the upper passivation layer and the back side and has a refractive index between that of the semiconductor substrate and that of the upper passivation layer. In some embodiments, the upper passivation layer descends into the semiconductor substrate to form a part of the back side deep trench isolation structure. In some embodiments, a dielectric liner for the back side deep trench isolation structure includes one or more layers of materials that exhibit fixed negative charges. In some embodiments, the upper passivation layer descends into the semiconductor substrate to form a core of the back side deep trench isolation structure. In some embodiments, the intermediate passivation layer comprises tantalum oxide (TaO). In some embodiments, the back side deep trench isolation structure comprises a substrate-embedded metal grid.

Some aspects of the present disclosure relate to an image sensor that includes photodetectors within a semiconductor substrate. A back side deep trench isolation structure extends into the back side of the semiconductor substrate to laterally surround the photodetectors. Within a first area, the back side deep trench isolation structure exhibits an abrupt narrowing that includes a discontinuous variation in a width of the BDTI structure versus a depth of the BDTI structure at a height that is within the semiconductor substrate and above a bottom of the BDTI structure.

Some aspects of the present disclosure relate to an image sensor that includes photodetectors within a semiconductor substrate and a back side deep trench isolation structure that extends into the back side between the photodetectors. In a first area, the back side deep trench isolation structure has an upper part and a lower part both of which are within the semiconductor substrate. The lower part is narrower and has a higher aspect ratio than the upper part. The semiconductor substrate forms a ledge at a juncture between the upper part and the lower part. In some embodiment, within the first area the back side isolation structure is continuously narrowing with greater depth into the semiconductor substrate. In some embodiments, an upper passivation layer and an intermediate passivation layer are on the back side. The intermediate passivation layer has a refractive index between that of the semiconductor substrate and that of the upper passivation layer. The upper passivation layer descends within the back side isolation structure to a depth below the upper part. In some embodiments the image sensor includes scribe lines having a depth equal to a depth of the ledge.

Some aspects of the present disclosure relate to method that include providing a semiconductor substrate including photodetectors in an array within an image sensing area. Trenches are formed in the back side of the semiconductor substrate using both a high-aspect ratio etch and a mouth etch. The high-aspect ratio etch includes etching through first slits having a first width. The mouth etch comprises etching through corresponding second slits having a second width. The second width is greater than the first width. The trenches are filled to form a back side deep trench isolation structure. In some embodiments there is an area that is masked during the mouth etch and in which the trenches are formed by the high-aspect ratio etch. In some embodiments the mouth etch forms trenches in a peripheral area and those peripheral area trenches are filled to provide scribe lines. In some embodiments, the high-aspect ratio etch is performed before the mouth etch. In some embodiments, the mouth etch is performed before the high-aspect ratio etch. In some embodiments, the filling the trenches comprises both depositing an intermediate passivation layer and an upper passivation layer over the intermediate passivation. The intermediate passivation has a refractive index between that of the semiconductor substrate and that of the upper passivation layer. In some embodiments, the filling the trenches comprises depositing metal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensor, comprising:

a semiconductor substrate having a first side and a second side;

photodetectors within the semiconductor substrate;

a transistor formed in the semiconductor substrate on the first side; and a deep trench isolation structure extending into the second side between two of the photodetectors, wherein the deep trench isolation structure comprises:

an upper portion proximate the second side;

a lower portion proximate the first side; and a ledge portion between the upper portion and the lower portion;

wherein the deep trench isolation structure progressively narrows with respect to distance from the second side within the upper portion; and the deep trench isolation structure abruptly narrows in the ledge portion.

2. The image sensor of claim 1, wherein the deep trench isolation structure progressively narrows with respect to distance from the second side within the lower portion.

3. The image sensor of claim 1, further comprising:

a first passivation layer on the second side; and a second passivation layer on the second side, wherein the first passivation layer is between the second passivation layer and the semiconductor substrate, and the first passivation layer has a refractive index between that of the second passivation layer and the semiconductor substrate.

4. The image sensor of claim 3, wherein extensions of the first and second passivation layers form parts of the deep trench isolation structure.

5. The image sensor of claim 1, wherein the photodetectors are photodiodes.

6. The image sensor of claim 1, further comprising color filters over the photodetectors on the second side.

7. The image sensor of claim 1, further comprising scribe lines, wherein the scribe lines have a depth corresponding to the upper portion.

8. An image sensor comprising:

a semiconductor substrate including a first side and a second side;

photodiodes arrayed within the semiconductor substrate;

an isolation structure extending into the semiconductor substrate between two of the photodiodes, wherein:

the isolation structure has an upper part and a lower part both of which are within the semiconductor substrate;

the lower part is narrower and has a higher aspect ratio than the upper part; and the semiconductor substrate forms a ledge at a juncture between the upper part and the lower part; and a passivation layer on the second side, wherein the passivation layer descends into the isolation structure past the ledge.

9. The image sensor of claim 8, further comprising transfer gates for the photodiodes, wherein the transfer gates are on the first side.

10. The image sensor of claim 9, wherein:

the isolation structure is part of an isolation grid; and the transfer gates are opposite cross-roads of the isolation grid.

11. The image sensor of claim 10, wherein in terms of distance from the second side, the isolation grid is shallower at the cross-roads.

12. The image sensor of claim 8, wherein the passivation layer has a refractive index higher than silicon dioxide.

13. The image sensor of claim 8, wherein:

the isolation structure is part of an isolation grid; and the isolation grid has cross-roads where the ledge is missing and the isolation grid is shallower.

14. A method comprising:

providing a semiconductor substrate having a first side, a second side, and an array of photodiodes within an image sensing area of the semiconductor substrate;

forming a trench within the image sensing area, wherein forming the trench comprises a first etch and a second etch, the first etch comprises etching through a first slit having a first width, the second comprises etching through a second slit having a second width, the second width is greater than the first width, and the second etch is performed at a distinct time from the first etch; and filling the trench to form an isolation structure between two photodiodes in the array of photodiodes.

15. The method of claim 14, wherein the second etch forms scribe lines in an area of the semiconductor substrate distal from the array of photodiodes.

16. The method of claim 14, wherein:

a mask defines the first slit; and the second slit is formed by processing the mask to widen the first slit.

17. The method of claim 16, wherein the mask is a photoresist, and processing the mask to widen the first slit comprises exposing the mask through a reticle.

18. The method of claim 14, wherein the first slit is part of a grid of slits in a over the image sensing area.

19. The method of claim 14, wherein:

the first etch etches a first area of the semiconductor substrate within the image sensing area;

the second etch etches a second area of the semiconductor substrate within the image sensing area;

the first and second areas overlap; and the first area includes areas that are non-overlapping with the second area.

20. The method of claim 14, wherein filling the trench comprises a metal deposition.

* * * * *